(12) United States Patent
Yamazaki et al.

(10) Patent No.: US 7,495,278 B2
(45) Date of Patent: *Feb. 24, 2009

(54) NON-VOLATILE MEMORY AND SEMICONDUCTOR DEVICE

(75) Inventors: Shunpei Yamazaki, Tokyo (JP); Jun Koyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/129,795

(22) Filed: May 16, 2005

(65) Prior Publication Data

US 2005/0218405 A1    Oct. 6, 2005

Related U.S. Application Data

(63) Continuation of application No. 10/424,575, filed on Apr. 28, 2003, now Pat. No. 6,900,499, which is a continuation of application No. 09/970,719, filed on Oct. 4, 2001, now Pat. No. 6,597,034, which is a continuation of application No. 09/138,691, filed on Aug. 24, 1998, now Pat. No. 6,323,515.

(30) Foreign Application Priority Data

Aug. 29, 1997  (JP)  .......... 9-249818
Apr. 27, 1998  (JP)  .......... 10-132750
May 25, 1998  (JP)  .......... 10-161365

(51) Int. Cl.
    *H01L 29/72*   (2006.01)

(52) U.S. Cl. .......... 257/314; 257/316; 257/347; 257/350; 257/52; 257/83; 257/88

(58) Field of Classification Search .......... 257/314, 257/52, 83, 88, 316, 347
See application file for complete search history.

(56) References Cited

U.S. PATENT DOCUMENTS 4,065,781 A    12/1977   Gutknecht .......... 357/23
4,394,688 A    7/1983    Lida et al. .......... 358/160

(Continued)

FOREIGN PATENT DOCUMENTS

EP    0 488 804 A1    6/1992

(Continued)

OTHER PUBLICATIONS

Shimokawa, R. et al, "Characterization of High-Efficiency Cast-Si Solar Cell Wafers by MBIC Measurement," Japanese Journal of Applied Physics, vol. 27, No. 5, pp. 751-758, May 1988.

(Continued)

*Primary Examiner*—Edward Wojciechowicz
(74) *Attorney, Agent, or Firm*—Cook Alex Ltd.

(57) ABSTRACT

A non-volatile memory comprising a semiconductor active layer provided on an insulating substrate, an insulating film provided on the. semiconductor active layer, a floating gate electrode provided on the insulating film, an anodic oxidized film obtained by anodic oxidation of the floating gate electrode, and a control gate electrode provided in contact with the anodic oxidized film, and a semiconductor device, particularly a liquid crystal display device comprising the non-volatile memory.

24 Claims, 26 Drawing Sheets

U.S. PATENT DOCUMENTS

| | | | |
|---|---|---|---|
| 5,027,175 A | 6/1991 | Iwasa | |
| 5,191,551 A | 3/1993 | Inoue | |
| 5,260,797 A | 11/1993 | Muraji et al. | 358/231 |
| 5,317,236 A | 5/1994 | Zavracky et al. | |
| 5,452,019 A | 9/1995 | Fukuda et al. | 348/655 |
| 5,469,365 A | 11/1995 | Diekema et al. | 702/62 |
| 5,481,317 A | 1/1996 | Hieda | 348/674 |
| 5,539,459 A | 7/1996 | Bullitt et al. | 348/254 |
| 5,541,138 A | 7/1996 | Yamazaki et al. | |
| 5,568,421 A * | 10/1996 | Aritome | 365/185.17 |
| 5,569,615 A | 10/1996 | Yamazaki et al. | |
| 5,642,295 A * | 6/1997 | Smayling | 702/182 |
| 5,643,826 A | 7/1997 | Ohtani et al. | 437/88 |
| 5,648,277 A | 7/1997 | Zhang et al. | 437/21 |
| 5,666,159 A | 9/1997 | Parulski et al. | 348/211 |
| 5,677,204 A * | 10/1997 | Imai et al. | 438/17 |
| 5,705,829 A | 1/1998 | Miyanaga et al. | 257/66 |
| 5,789,292 A | 8/1998 | Yamazaki et al. | |
| 5,793,344 A | 8/1998 | Koyama | 345/87 |
| 5,809,520 A * | 9/1998 | Edwards et al. | 711/115 |
| 5,895,935 A | 4/1999 | Yamazaki et al. | 257/59 |
| 5,923,962 A | 7/1999 | Ohtani et al. | 438/150 |
| 5,926,562 A | 7/1999 | Hyodo et al. | 382/167 |
| 5,933,199 A | 8/1999 | Yoon | 348/674 |
| 5,965,915 A | 10/1999 | Yamazaki et al. | |
| 5,982,427 A | 11/1999 | Hunt et al. | 348/254 |
| 5,982,462 A | 11/1999 | Nakano et al. | 349/43 |
| 6,004,847 A | 12/1999 | Clementi et al. | 438/258 |
| 6,232,136 B1 | 5/2001 | Zavracky et al. | |
| 6,323,515 B1 * | 11/2001 | Yamazaki et al. | 257/316 |
| 6,335,716 B1 | 1/2002 | Yamazaki et al. | |
| 6,424,008 B1 | 7/2002 | Yamazaki et al. | |
| 6,433,382 B1 | 8/2002 | Orlowski et al. | 257/315 |
| 6,472,684 B1 | 10/2002 | Yamazaki et al. | |
| 6,597,034 B2 * | 7/2003 | Yamazaki et al. | 257/314 |
| 6,627,953 B1 | 9/2003 | Vu et al. | |
| 6,670,635 B1 | 12/2003 | Yamazaki et al. | |
| 6,686,623 B2 | 2/2004 | Yamazaki | |
| 6,900,499 B2 * | 5/2005 | Yamazaki et al. | 257/314 |
| 7,067,403 B2 | 6/2006 | Yamazaki et al. | |
| 7,126,156 B2 | 10/2006 | Yamazaki et al. | |
| 2003/0025156 A1 | 2/2003 | Yamazaki et al. | |
| 2004/0104424 A1 | 6/2004 | Yamazaki | |
| 2005/0181562 A1 | 8/2005 | Yamazaki et al. | |
| 2007/0034873 A1 | 2/2007 | Yamazaki et al. | |

FOREIGN PATENT DOCUMENTS

| | | |
|---|---|---|
| JP | 2-63163 | 3/1990 |
| JP | 2-65276 | 3/1990 |
| JP | 5-36989 | 2/1993 |
| JP | 6-151344 | 5/1994 |
| JP | 7-86532 | 3/1995 |
| JP | 07-130652 | 5/1995 |
| JP | 07-135318 | 5/1995 |
| JP | 07-321339 | 12/1995 |
| JP | 08-078329 | 3/1996 |
| JP | 10-294280 | 11/1998 |
| JP | 11-345767 | 12/1999 |
| JP | 11-354442 | 12/1999 |

OTHER PUBLICATIONS

U.S. Appl. No. 09/144,538 (pending) to Yamazaki et al, including specification, claims, abstract and drawings.

*McGraw-Hill Dictionary of Scientific and Technical Terms*, 5th edition, p. 1622, (definition of "quartz") and p. 1826 (definition of "silicon-on-insulator").

* cited by examiner

PRODUCTION STEP OF FLOATING GATES

25°C

90°C

150°C

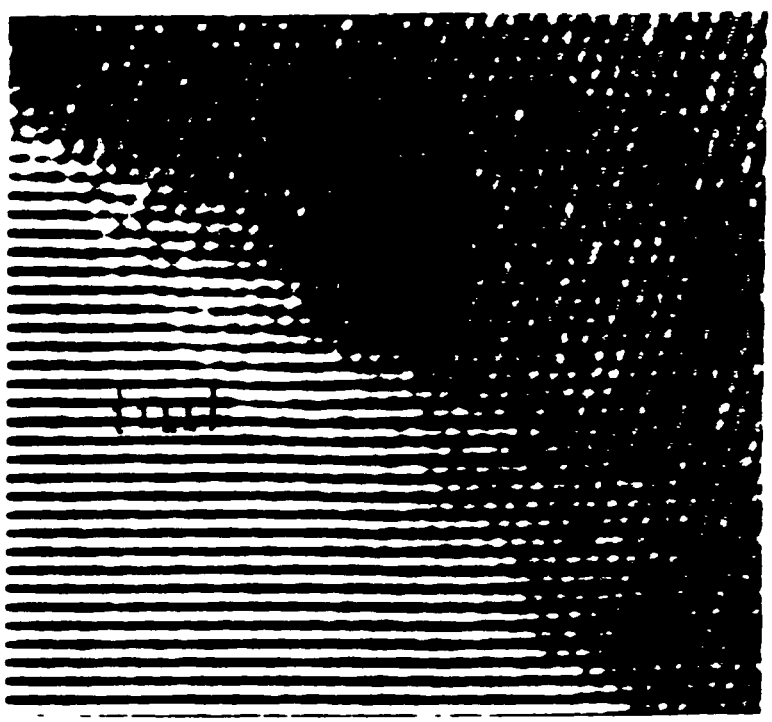
FIG. 24A  ←5 nm→
FIG. 24B  ←5 nm→

0.1 μm 0.1 μm

FIG. 27A  ←2 μm→
FIG. 27B  ←2 μm→

NON-VOLATILE MEMORY AND SEMICONDUCTOR DEVICE

This application is a continuation of U.S. application Ser. No. 10/424,575, filed on Apr. 28, 2003 now U.S. Pat. No. 6,900,499 which is a continuation of U.S. application Ser. No. 09/970,719, filed on Oct. 4, 2001 (U.S. Pat. No. 6,597,034 issued Jul. 22, 2003) which is a continuation of U.S. application Ser. No. 09/138,691, filed on Aug. 24, 1998 (now U.S. Pat. No. 6,323,515 issued Nov. 27, 2001).

FIELD OF THE INVENTION

The present invention relates to a semiconductor device and a semiconductor display device. Particularly, it relates to a semiconductor device and a semiconductor display device, in which a non-volatile memory is integrated with pixels and peripheral circuits, such as driving circuits, on an insulating substrate using the SOI (silicon on insulator) technique.

BACKGROUND OF THE INVENTION

Recently, a technique for producing a semiconductor device, in which semiconductor thin films are formed on an inexpensive glass substrate, such as a thin film transistor (TFT), has been quickly developed. This is because there is an increasing demand for an active matrix liquid crystal display device (liquid crystal panel).

An active matrix liquid crystal panel is composed of several tens to several millions of pixel areas, at each of which a TFT is arranged, and electric charges going in and out the respective pixel electrodes are controlled by a switching function of the TFTs.

A conventional analogue gradation type active matrix liquid crystal display device is shown in FIG. 19. The conventional active matrix liquid crystal display device has a driver on a source line side 2001, a driver on a gate line side 2002, plural pixel TFTs 2003 disposed in a matrix form, and image signal lines 2004, as shown in FIG. 19.

The driver on a source line side and the driver on a gate line side each contains a shift register and a buffer circuit, which are recently integrated on the same substrate as the active matrix circuit.

In the active matrix circuit, thin film transistors utilizing amorphous silicon formed on a glass substrate are arranged.

It has been known to produce a thin film transistor using a polycrystalline silicon film on quartz as a substrate. In this case, peripheral driver circuits and an active matrix circuit are produced with thin film transistors formed on a quartz substrate.

It has been also known to produce a thin film transistor using a crystalline silicon film on a glass substrate utilizing a laser annealing technique. By using this technique, an active matrix circuit and peripheral driver circuits can be integrated on a glass substrate.

In the constitution shown in FIG. 19, image signals supplied to the image signal line 2004 are selected by signals from a shift register circuit of the driver on a source line side (shift register for horizontal scanning), and the prescribed image signals are supplied to the corresponding source signal line.

The image signals supplied to the source signal line are selected by a thin film transistor of a pixel, and written in the prescribed pixel electrode.

The thin film transistor of the pixel is driven by selection signals supplied from a shift register circuit of the driver on a gate signal line side (shift register for vertical scanning) via the gate signal lines.

These operations are repeated one after another at suitable timing with the signals from the shift register of the driver on a source signal line side and the signals from the shift register of the driver on a gate signal line side, and the signals of an image are written in the respective pixels disposed in a matrix form.

An active matrix liquid crystal display device is frequently used in a portable personal computer in recent years. In a personal computer, because operations are often conducted, where plural softwares are simultaneously operated and an image is imported from a digital camera, a liquid crystal display of multiple gradation is required.

A demand of a liquid crystal projection display capable of displaying a large scale picture is being increased. The image quality of such a display depends on the fineness of gradation display and the fastness of signal processing.

The methods of gradation display include the case where analogue signals such as video signals and television signals are supplied to the source lines (analogue gradation) and the case where digital signals such as those from a personal computer are supplied (digital gradation).

In the case of analogue gradation as described above, the analogue image signals supplied to the image signal line are selected one after another by signals from the source driver to supply the prescribed image signal is supplied to the corresponding source line.

In the case of digital gradation, the digital signals supplied to the image signal line are selected one after another, and after subjected to digital/analogue conversion, the prescribed image signal is supplied to the corresponding source line.

In any case of gradation display, liquid crystal display devices have the relationship between the voltage (V) applied to the liquid crystal and the transmission light intensity shown as the dotted line in FIG. 20. The liquid crystal display used herein is one of a normally white mode, which transmits light when a voltage is not applied in TN (twisted nematic) mode.

It is understood from FIG. 20 that there is a non-linear relationship between a voltage applied to the liquid crystal and the transmission light intensity, and it is difficult to display gradation corresponding to the applied voltage.

Gamma correction is employed in order to compensate the difficulty. In gamma correction, the image signals are gained to correct so that the transmission light intensity is linearly changed corresponding to the applied voltage, by which good gradation display is obtained. The relationship between the applied voltage and the transmission light intensity is shown as the solid line in FIG. 20.

In order to make gamma correction on the image signals, however, an IC chip equipped with a signal processing circuit and a memory circuit has been required. Furthermore, in order to display a large scale picture, another correction circuit and signal processing circuit, as well as a memory circuit associated with them, have been required. The signal processing circuit and the memory circuit have been provided as an IC chip equipped outside the liquid crystal display panel. Accordingly, the miniaturization of commercial products has been practically impossible.

SUMMARY OF THE INVENTION

FIGS. 22A, 22B and 22C are graphs showing relationship between the substrate temperature and gate leak current of a P-channel TFT. FIG. 23A is a graph showing relationship between the substrate temperature and the peaks of the gate leak current of a P-channel TFT. VD denotes a drain voltage, ID denotes a drain current, and VG represents a gate voltage. The gate leak current has a peak value (denoted by IG(peak)) in this case.

It is understood that when the substrate temperature is increased, the peak of the gate leak current is decreased. This is considered to indicate that release of the electric charges (electrons) accumulated in the gate electrode is accelerated by the increase of the substrate temperature.

It has been known that the gate leak current is a current observed by the injection of electrons to the gate electrode. The decrease of the absolute value of the gate leak current (IG(peak)) means that the injected electrons are activated and discharged by the temperature increase. This phenomenon is the same as that occurring in a capacitor and suggests that charge and discharge of electricity are possible.

The inventors of the present invention have found that this phenomenon can be applied to a non-volatile memory having a floating gate.

Under the circumstances, an object of the invention is to provide a semiconductor display device, particularly a liquid crystal display device, capable of conducting good gradation display of a large scale picture and capable of being subjected to miniaturization.

According to one embodiment of the invention, a non-volatile memory is provided, which comprises:

a semiconductor active layer provided on an insulating substrate;

an insulating film provided on the semiconductor active layer;

a floating gate electrode provided on the insulating film;

an anodic oxidized film obtained by anodic oxidation of the floating gate electrode; and a control gate electrode provided in contact with an upper surface and a side surface of the anodic oxidized film. The object of the invention can be attained by this embodiment.

The number of unpaired bonds in the channel forming region of the semiconductor active layer may be smaller than that in the source drain region.

According to another embodiment of the invention, a non-volatile memory is provided, which comprises:

a semiconductor active layer provided on an insulating substrate;

an insulating film provided on the semiconductor active layer;

a floating gate electrode provided on the insulating film;

an anodic oxidized film obtained by anodic oxidation of the floating gate electrode; and a control gate electrode provided in contact only with an upper surface of the anodic oxidized film. The object of the invention can be attained by this embodiment.

The number of unpaired bonds in the channel forming region of the semiconductor active layer may be smaller than that in the source drain region.

According to still another embodiment of the invention, a non-volatile memory is provided, which comprises:

a semiconductor active layer provided on an insulating substrate;

an insulating film provided on the semiconductor active layer;

a floating gate electrode provided on the insulating film;

an anodic oxidized film obtained by anodic oxidation of the floating gate electrode; and a control gate electrode provided in contact with an upper surface and a side surface of the anodic oxidized film, provided that a channel region and a source drain region of the semiconductor active layer are in direct contact with each other. The object of the invention can be attained by this embodiment.

The number of unpaired bonds in the channel forming region of the semiconductor active layer may be smaller than that in the source drain region.

According to still another embodiment of the invention, a non-volatile memory is provided, which comprises:

a semiconductor active layer provided on an insulating substrate;

an insulating film provided on the semiconductor active layer;

a floating gate electrode provided on the insulating film;

an anodic oxidized film obtained by anodic oxidation of the floating gate electrode; and a control gate electrode provided in contact only with an upper surface of the anodic oxidized film, provided that a channel region and a source drain region of the semiconductor active layer are in direct contact with each other. The object of the invention can be attained by this embodiment.

The number of unpaired bonds in the channel forming region of the semiconductor active layer may be smaller than that in the source drain region.

According to still another embodiment of the invention, a semiconductor device is provided, which comprises:

a pixel circuit provided on an insulating substrate, the pixel circuit comprising plural pixel TFTs arranged in a matrix form;

a driver circuit comprising TFTs driving the plural pixel TFTs; and a-non-volatile memory, the non-volatile memory comprising a semiconductor active layer provided on an insulating substrate, an insulating film provided on the semiconductor active layer, a floating gate electrode provided on the insulating film, an anodic oxidized film obtained by anodic oxidation of the floating gate electrode, and a control gate electrode provided in contact with an upper surface and a side surface of the anodic oxidized film, the pixel circuit, the driver circuit and the non-volatile memory being integrated on the insulating substrate. The object of the invention can be attained by this embodiment.

According to still another embodiment of the invention, a semiconductor device is provided, which comprises:

a pixel circuit provided on an insulating substrate, the pixel circuit comprising plural pixel TFTs arranged in a matrix form;

a driver circuit comprising TFTs driving the plural pixel TFTs; and a non-volatile memory, the non-volatile memory comprising a semiconductor active layer provided on an insulating substrate, an insulating film provided on the semiconductor active layer, a floating gate electrode provided on the insulating film, an anodic oxidized film obtained by anodic oxidation of the floating gate electrode, and a control gate electrode provided in contact only with an upper surface of the anodic oxidized film, the pixel circuit, the driver circuit and the non-volatile memory being integrated on the insulating substrate. The object of the invention can be attained by this embodiment.

The semiconductor device may be a liquid crystal display device.

BRIEF DESCRIPTION OF THE DRAWINGS

FIGS. 24A and 24B are HR-TEM photographs showing magnified views of crystal grain boundaries of semiconductor thin films.

FIGS. 27A and 27B are photographs showing dark-field images of semiconductor thin films.

DETAILED DESCRIPTION OF THE PREFERRED EMBODIMENTS

Example 1

In this Example, a semiconductor display device is explained, in which a non-volatile memory for storing data used on signal processing is integrated with other circuits on an insulating substrate using an SOI (silicon on insulator) technique. Among the semiconductor display devices, a liquid crystal display device is explained herein. The silicon used herein is in a single crystal form or substantially in a single crystal form.

Figure 1:
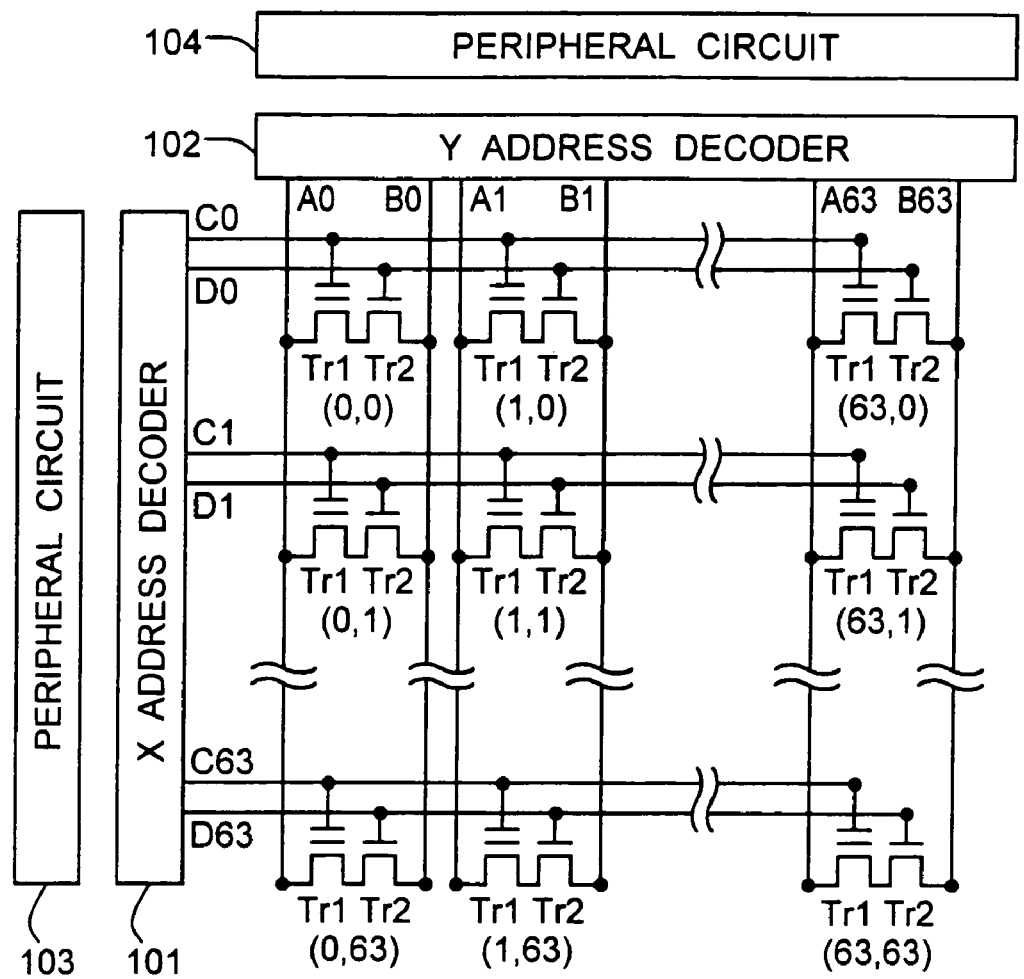
FIG. 1 is a circuit diagram of a non-volatile memory according to the invention.

FIG. 1 shows a circuit diagram of a non-volatile memory of the Example. The non-volatile memory comprises plural memory cells, X and Y address decoders 101 and 102, and peripheral circuits 103 and 104. As shown in FIG. 1, the memory cell, in which a respective bit information is recorded, comprises two TFTs, one of which is a P-channel FAMOS (floating gate avalanche injection MOS) TFT having a floating gate (Tr1) and the other is an N-channel-switching TFT (Tr2). The two TFTs (Tr1 and Tr2) are connected by their drain electrode in series, and a memory cell for one bit is constituted by the series connection circuit. In the non-volatile memory in the Example, the memory cells are arranged in a matrix form of 64 in column and 64 in row. Since each of the memory cells stores one bit information, the non-volatile memory of the Example has a memory capacity of 4,096 bits (ca. 4 kilobits). The peripheral circuits 103 and 104 are circuits for processing other signals.

The both ends of the memory cells arranged in each row are connected to the signal lines A0, B0 to A63, B63. The gate electrodes of the memory cells arranged in each column are connected to the signal lines C0, D0 to C63, D63. In the Example, symbols such as (0,0), (1,0) and (63,63) are assigned to the memory cells constituting the non-volatile memory as shown in FIG. 1.

The signal lines A0, B0 to A63, B63 and C0, D0 to C63, D63 are connected to the Y address decoder 102 and the X address decoder 101, respectively. The address of the memory cell is assigned by the Y address decoder 102 and the X address decoder 101, and the data is written in or read out.

The operation of the non-volatile memory is then explained by exemplifying the memory cell (1,1).

In the case where data is written in the memory cell (1,1), a high voltage of 50 V is applied to the signal line C1, and a voltage of 5 V is applied to the signal line D1. The signal line B1 is then grounded, and a voltage of –5 V is applied to A1. Electric charges are thus accumulated in the floating gate of Tr1. The electric charges accumulated the floating gate of Tr1 are maintained.

In the case where data is read out from the memory cell (1,1), a voltage of 0 V is applied to the signal line C1, and a voltage of 5 V is applied to D1. The signal line B1 is then grounded, and the recorded signal is thus read out from A1.

The operation above are summarized in Table 1 below.

TABLE 1

|  | A1 (V) | B1 (V) | C1 (V) | D1 (V) |
|---|---|---|---|---|
| Write in | 0 or −5 | GROUND | 50 | 5 |
| Read out |  | GROUND | 0 | 5 |

The data stored in the memory cells can be erased by irradiating the non-volatile memory with an X-ray, an ultraviolet ray or an electron beam, or by heating the non-volatile memory.

A production process of a semiconductor device equipped with the non-volatile memory of the Example is then explained. Among the semiconductor devices, a production process of a liquid crystal display device is explained. In the liquid crystal display device explained herein, the non-volatile memory of the Example is used as means for storing data of gamma correction.

In the Example, a process is exemplified, in which plural TFTs are formed on an insulating surface of a substrate, and a matrix circuit of a pixel region and peripheral circuits including a driver circuit are constituted as a monolithic structure, as shown in FIGS. 2A through 5C. The non-volatile memory storing the gamma correction data contains a P-channel FAMOS circuit having a floating gate and its switching element. The production process of the non-volatile memory and the pixel TFTs are explained. A CMOS circuit, which is typically used as peripheral circuits such as a driver circuit, can also be produced in the similar process. While the production process of a circuit, in which a P-channel TFT and an N-channel TFT each having one gate electrode, is explained in the Example, a circuit having plural gate electrodes such as a double gate type can also be produced by the similar process.

FIGS. 2A to 2D are referred. A quartz substrate 201 is provided as a substrate having an insulating surface. A silicon substrate having a thermal oxidized film on the surface can be used instead of the quartz substrate. Furthermore, a substrate can be obtained by forming an amorphous silicon film on a quartz substrate, and then thermally oxidizing the film completely. A quartz substrate or a ceramics substrate having a silicon nitride film as an insulating film can also be used.

Numeral 202 denotes an amorphous silicon film, which is controlled to have a final thickness (thickness considering the thinning after thermal oxidation) of from 10 to 100 nm, preferably from 20 to 80 nm. By controlling to such a final thickness, impact ionization is liable to occur in an FAMOS TFT, and the injection of carrier into the floating gate is liable to occur. It is important to carefully control the impurity concentration of the film upon formation of the film. The thickness of the amorphous silicon film of the FAMOS TFT may be from 10 to 400 nm and that of other TFTs may be from 20 to 80 nm. In these cases, the desired thickness can be obtained by a selective oxidation process.

In the Example, the concentrations of C (carbon), N (nitrogen), O (oxygen) and S (sulfur), the representative impurities, in the amorphous silicon film 202 are all controlled to less than $5 \times 10^{18}$ atoms/cm$^3$, preferably $1 \times 10^{18}$ atoms/cm$^3$ or less. In the case where these impurities are present in a concentration of more than $5 \times 10^{18}$ atoms/cm$^3$, they adversely affect on crystallization, which may be a reason of deterioration of the film quality after crystallization.

The hydrogen concentration of the amorphous silicon film 202 is also an important factor. It is considered that a film having good crystallinity can be obtained by suppressing the hydrogen concentration. The amorphous silicon film 202 is therefore preferably formed by the low pressure thermal CVD process. The plasma CVD process can also be employed by optimizing the film forming conditions.

The step of crystallization of the amorphous silicon film 202 is then conducted. As means for crystallization, the technique described in Unexamined Published Japanese Patent Application No. 7-130652 is employed. While either the process in Example 1 or Example 2 of the publication may be employed, it is preferred in the Example to use the process of Example 2 of the publication, the technical contents of which are described in detail in Unexamined Published Japanese Patent Application No. 8-78329.

In the technique described in Unexamined Published Japanese Patent Application No. 8-78329, a mask insulating film 203 is formed to select the region to which a catalytic element is added. The mask insulating film 203 has plural openings for the addition of a catalytic element. The position of the crystallized region can be controlled by adjusting the position of the openings.

Figure 2A:
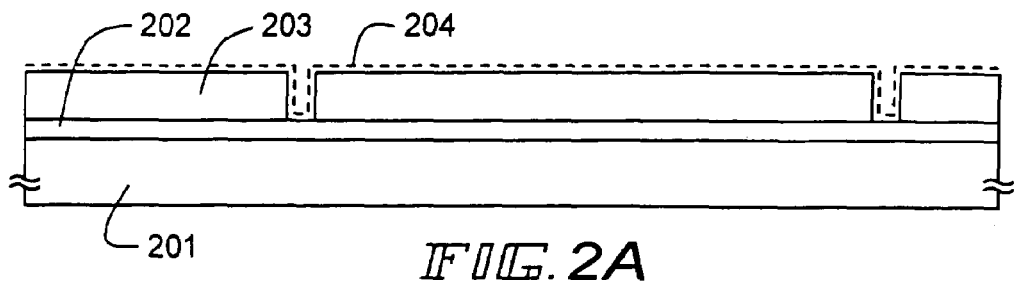
FIGS. 2A to 2D are diagrammatic illustrations showing a production process of a liquid crystal display device containing a non-volatile memory of the invention.

A solution containing nickel (Ni) as a catalytic element accelerating the crystallization of the amorphous silicon film 202 is coated by a spin coating method to form an Ni-containing layer 204. As a catalytic element, cobalt (Co), iron (Fe), palladium (Pd), platinum (Pt), copper (Cu), gold (Au) and germanium (Ge) can be used instead of nickel. The state until this step is shown in FIG. 2A.

As the addition step of the catalytic element, an ion injection method or a plasma doping method using a resist mask can be used. In these cases, it is easy to suppress the exclusive area of the addition region and to control the growing length of the growing region in the vertical direction, and thus these techniques are useful to produce a fine circuit.

After completing the addition step of the catalytic element, the hydrogen is removed at 450° C. for about 1 hour, and crystallization of the amorphous silicon film 202 is conducted by a heat treatment in an inert atmosphere, a hydrogen atmosphere or an oxygen atmosphere at a temperature of from 500 to 700° C., typically from 550 to 650° C., for from 4 to 24 hours. In the Example, a heat treatment is conducted in a nitrogen atmosphere at 570° C. for 14 hours.

Figure 2B:
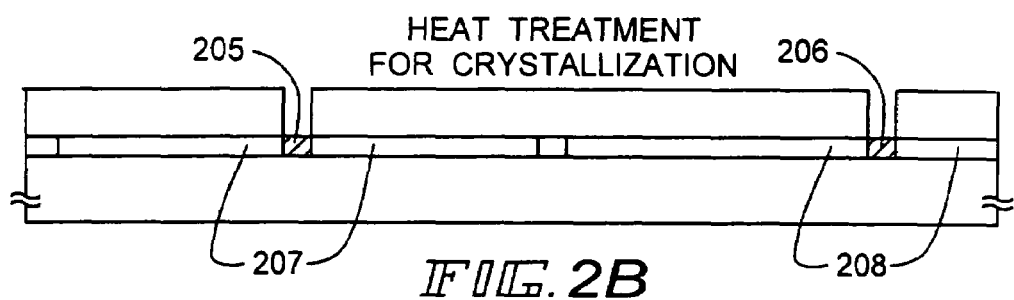

In this step, the crystallization of the amorphous silicon film 202 dominantly proceeds at the regions 205 and 206, to which nickel is added, and crystalline regions 207 and 208 are formed, which grow in a direction substantially parallel to the substrate surface of the substrate 201. The crystalline regions 207 and 208 are called lateral growing regions. Since the lateral growing regions contain crystals that are accumulated in a relatively uniform state, it advantageously has excellent crystallinity. The state until this step is shown in FIG. 2B.

In the case where the technique described in Example 1 of Unexamined Published Japanese Patent Application No. 7-130652 is employed, regions that can be considered as horizontal growing regions in a microscopic view are formed. However, it is disadvantageously difficult to control crystalline boundaries since nucleus generation occurs non-uniformly in the film.

Figure 2C:
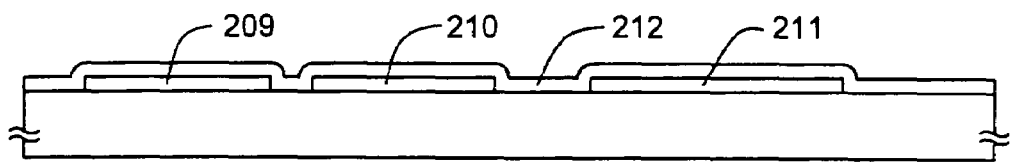

After completing the heat treatment for crystallization, the mask insulating film 203 is removed, and patterning is conducted to form semiconductor layers (active layers) in an island form 209, 210 and 211 formed from the lateral growing regions 207 and 208. The state until this step is shown in FIG. 2C.

Numeral 209 denotes an active layer of a P-channel FAMOS TFT, 210 denotes an active layer of an N-channel switching TFT, and 211 denotes an active layer of an N-type TFT (pixel TFT) constituting a pixel matrix circuit.

After providing the active layers 209, 210 and 211, a gate insulating film 212 composed of an insulating film containing silicon is provided on them. The thickness of the gate insulating film is from 10 to 200 nm. The thickness of the gate insulating film of the FAMOS TFT may be from 10 to 50 nm and that of other TFTs may be from 50 to 200 nm. $SiO_2$, SiON and SiN may be used as the gate insulating layer.

Figure 2D:
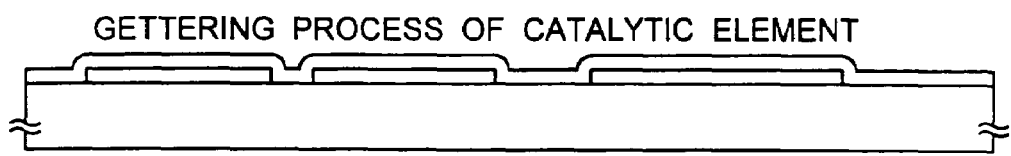

A heat treatment for removing or reducing the catalytic element (nickel) (gettering process of catalytic element) is then conducted as shown in FIG. 2D. In the heat treatment, a halogen element is added to the treatment atmosphere to utilize the gettering effect of metallic elements by the halogen element.

In order to sufficiently utilize the gettering effect of the halogen element, the heat treatment is preferably conducted at a temperature over 700° C. At temperatures below 700° C., decomposition of the halogen compound in the treatment atmosphere becomes difficult, and the gettering effect may not be obtained.

Thus the heat treatment in the Example is conducted at a temperature over 700° C., preferably from 800 to 1,000° C. (typically 950° C.), and the treating time is from 0.1 to 6 hours, typically from 0.5 to 1 hour.

This Example exemplifies the heat treatment that is conducted using an oxygen atmosphere containing from 0.5 to 10% by volume (3% by volume in the Example) of hydrogen chloride (HCl) at 950° C. for 30 minutes. When the HCl concentration is more than the above value, it is not preferred since unevenness occurs on the surface of the active layers 209, 210 and 211.

While the case using HCl gas as a compound containing a halogen element is exemplified above, other gasses, typically one or more selected from halogen-containing compound, e.g., HF, $NF_3$, HBr, $Cl_2$, $ClF_3$, $BCl_3$, $F_2$ and $Br_2$, may be used.

In the gettering process, it is considered that nickel contained in the active layers 209, 210 and 211 is subjected to gettering by the function of chlorine and removed in the form of volatile nickel chloride, which is released into the air. The nickel concentration of the active layer 209, 210 and 211 is reduced to $5 \times 10^{17}$ atoms/cm$^3$ or less in this step.

The value of $5 \times 10^{17}$ atoms/cm$^3$ or less is the lower detection limit of SIMS (secondary ion mass spectrum) analysis. While as a result of analysis of a TFT that was prepared by the inventors experimentally, any influence of nickel on the TFT characteristics was not observed at a nickel concentration of $1 \times 10^{18}$ atoms/cm$^3$ or less (preferably $5 \times 10^{17}$ atoms/cm$^3$ or less), the impurity concentration in the invention is defined by the minimum value of SIMS analysis.

Thermal oxidation proceeds at the interface between the active layers 209, 210 and 211 and the gate insulating film 212 on the heat treatment, and the thickness of the gate insulating film 212 increases by the thickness of the thermal oxidation film thus produced. By forming the thermal oxidation film according to these procedures, a semiconductor/insulation film interface with an extremely low interface state can be obtained. It also has an effect of preventing incomplete formation of the thermal oxidation film at the edge of the active layer (edge thinning).

Furthermore, it is effective to conduct a heat treatment in a nitrogen atmosphere at 950° C. for about 1 hour to improve the film quality of the gate insulating film 212, after completing the heat treatment in a halogen atmosphere.

It was confirmed by SIMS analysis that the halogen element used for gettering process was remained in the active layers 209, 210 and 211 at a concentration of from $1 \times 10^{15}$ atoms/cm$^3$ to $1 \times 10^{20}$ atoms/cm$^3$. It was also confirmed by SIMS analysis that the halogen element is distributed in a high concentration between the active layers 209, 210 and 211 and the thermal oxidation film formed by the heat treatment.

Furthermore, as a result of SIMS analysis for other elements, it was confirmed that the concentrations of the representative impurities, C (carbon), N (nitrogen), O (oxygen) and S (sulfur) were each less than $5 \times 10^{18}$ atoms/cm$^3$ (typically $1 \times 10^{18}$ atoms/cm$^3$ or less).

Figure 3A:
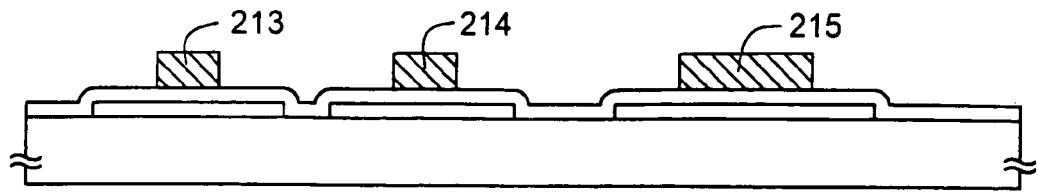
FIGS. 3A to 3D are diagrammatic illustrations showing a production process of a liquid crystal display device containing a non-volatile memory of the invention.

FIGS. 3A to 3D are now referenced. A metallic film (not shown in Figure) containing aluminum as a main component is formed and then subjected to patterning to produce bases 213, 214 and 215 of gate electrodes formed later. An aluminum film containing 2% by weight of scandium is used in the Example. The state until this step is shown in FIG. 3A. A part of the base 213 becomes a floating gate of a P-channel FAMOS TFT.

According to the technique described in Unexamined Published Japanese Patent Application No. 7-135318, porous anodic oxidized films 216, 217 and 218, non-porous anodic oxidized films 219, 220 and 221, and gate electrodes 222, 223 and 224 are formed. The state until this step is shown in FIG. 3B.

Figure 3B:
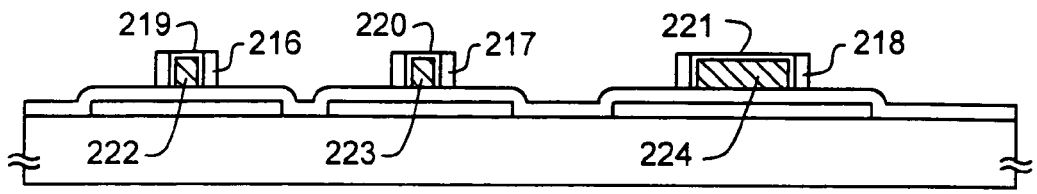
Figure 3C:
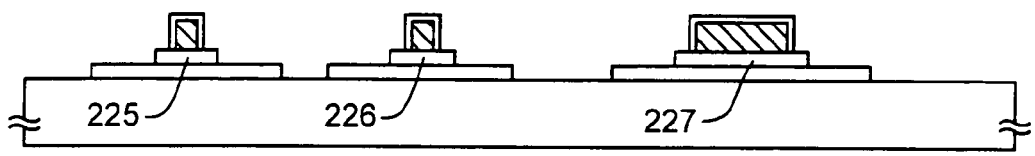

After obtained the state shown in FIG. 3B, the gate insulating film 212 is etched by using the gate electrodes 222, 223 and 224 and the porous anodic oxidized films 216, 217 and 218 as a mask. The porous anodic films 216, 217 and 218 are then removed to obtain the state shown in FIG. 3C. In FIG. 3C, numerals 225, 226 and 227 denote the gate insulation film after processing.

Figure 3D:
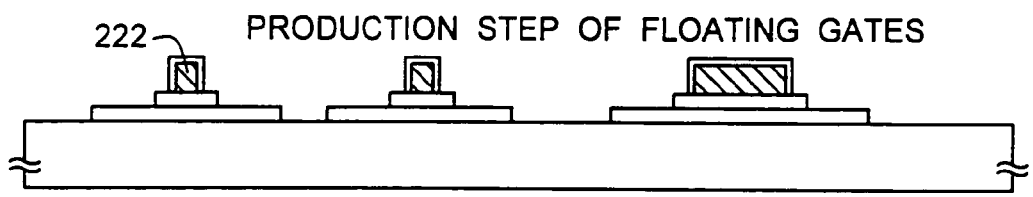

The gate electrode 222 is then cut off to produce a floating gate. The state until this step is shown in FIG. 3D.

FIGS. 4A to 4E are now referenced. Impurity elements giving one electro-conductivity are added. As the impurity elements, P (phosphorous) or As (arsenic) may be used for N-type and B (boron) may be used for P-type.

In the Example, the addition of the impurity is conducted as divided into two steps. In the first step, the addition of an impurity (P (phosphorous) in the Example) is conducted at a high acceleration voltage of about 80 keV to form an n⁻ region. In the n⁻ region, the P ion concentration is controlled to $1 \times 10^{17}$ atoms/cm$^3$ or more (preferably $1 \times 10^{18}$ atoms/cm$^3$ or more).

In the second step, the addition of the impurity is conducted at a low acceleration voltage of about 10 keV to form an n⁺ region. In this addition, the gate insulating film functions as a mask because of the low acceleration voltage. In the n⁺ region, the sheet resistance is controlled to 500 Ω or less (preferably 300 Ω or less)

Figure 4A:
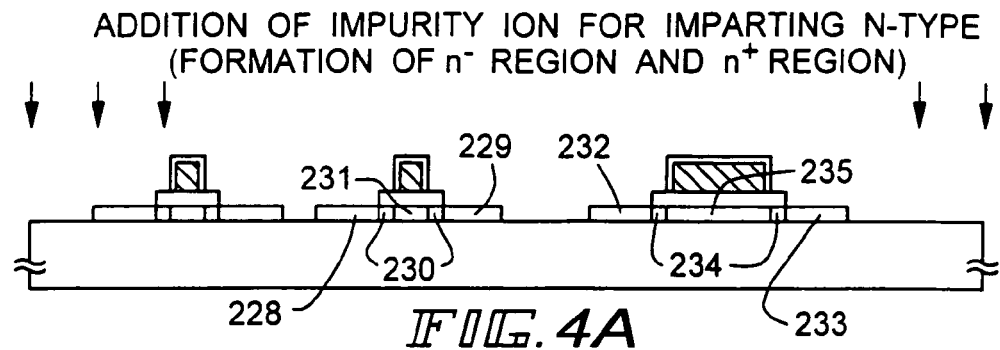
FIGS. 4A to 4E are diagrammatic illustrations showing a production process of a liquid crystal display device containing a non-volatile memory of the invention.

Throughout the above procedures, a source region 228, a drain region 229, a low concentration impurity region 230 and a channel forming region 231 of an N-type TFT are prepared. A source region 232, a drain region 233, a low concentration impurity region 234 and a channel forming region 235 of an N-type TFT constituting the pixel TFT are fixed. The state until this step is shown in FIG. 4A. In the Example, the number of unpaired bonds in the channel forming region of the semiconductor active layer is smaller than that in the source and drain regions. It is considered that this is because the channel forming region is in a single crystal form or substantially in a single crystal form.

In the state shown in FIG. 4A, the active layer of P-type TFT and the active layer of N-type TFT have the same constitution.

Figure 4B:
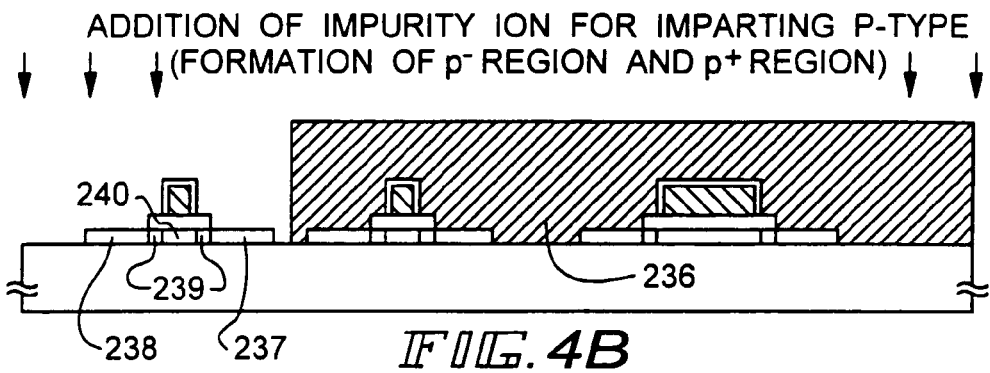

As shown in FIG. 4B, a resist mask 236 is provided covering the N-type TFT, and addition of an impurity ion giving P-type (boron in the Example) is conducted. Ga and In may be used as the impurity other than boron.

This addition process is also conducted as divided into two steps as similar to the previous step of impurity addition. It is required in this process to invert N-type to P-type, and B (boron) ions are added in a concentration higher by several times the concentration of the P-type ion previously added. In the p⁻ region thus formed, the concentration of the P-type ion is controlled to $1 \times 10^{17}$ atoms/cm$^3$ or more (preferably $1 \times 10^{18}$ atoms/cm$^3$ or more).

Thus, a source region 237, a drain region 238, a low concentration impurity region 239 and a channel forming region 240 of a P-type TFT are prepared. The state until this step is shown in FIG. 4B. In the low concentration impurity region, the concentration of the P-type ion is controlled to $1 \times 10^{17}$ atoms/cm$^3$ or more (preferably $1 \times 10^{18}$ atoms/cm$^3$ or more). By controlling the concentration of the P-type ion in this range, the impact ionization may be liable to occur.

After completing the formation of the active layer, activation of the impurity ions is conducted by the combination of furnace annealing, laser annealing and lamp annealing. At the same time, damage of the active layer suffered in the addition processes is restored.

Figure 4C:
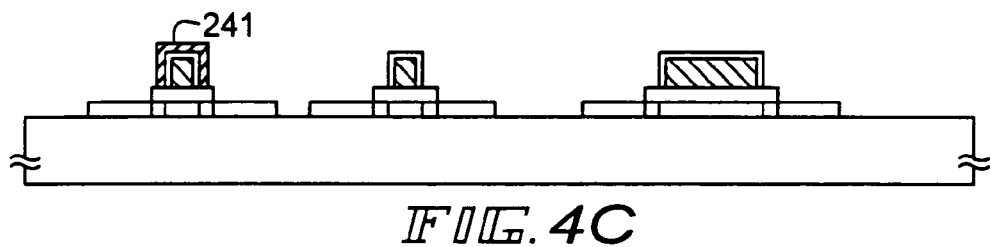

A control gate electrode 241 of a P-channel FAMOS TFT is prepared. The control gate electrode 241 is formed in contact with the upper surface and the side surface of the non-porous anodic oxidized film 219. Therefore, insulation between the control gate electrode 241 and the floating gate electrode 222' is maintained. The state until this step is shown in FIG. 4C.

Figure 4D:
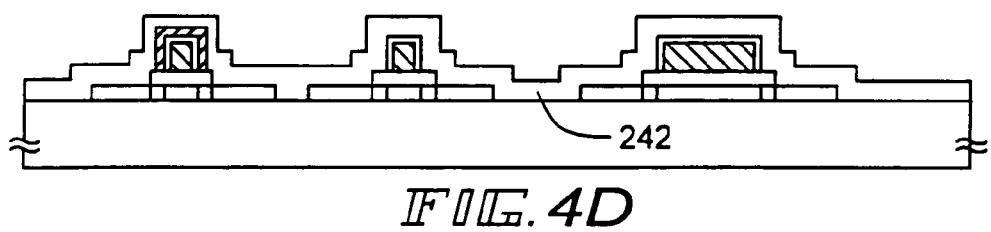
Figure 4E:
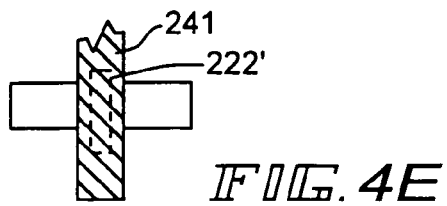

A laminated film of a silicon oxide film and a silicon nitride film is formed as an interlayer insulating film 242 as shown in FIG. 4D. FIG. 4E is a top view of the FAMOS TFT shown in FIG. 4D.

Figure 5A:
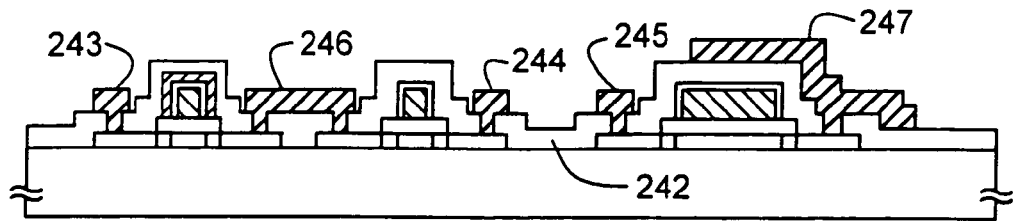
FIGS. 5A to 5C are diagrammatic illustrations showing a production process of a liquid crystal display device containing a non-volatile memory of the invention.
Figure 5B:
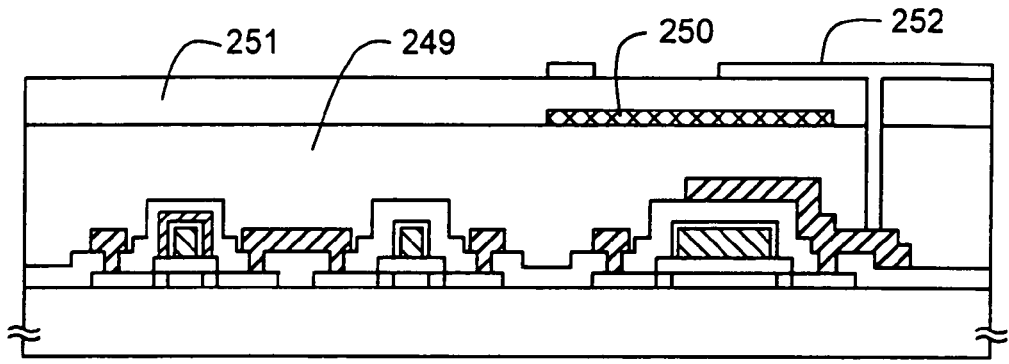
Figure 5C:
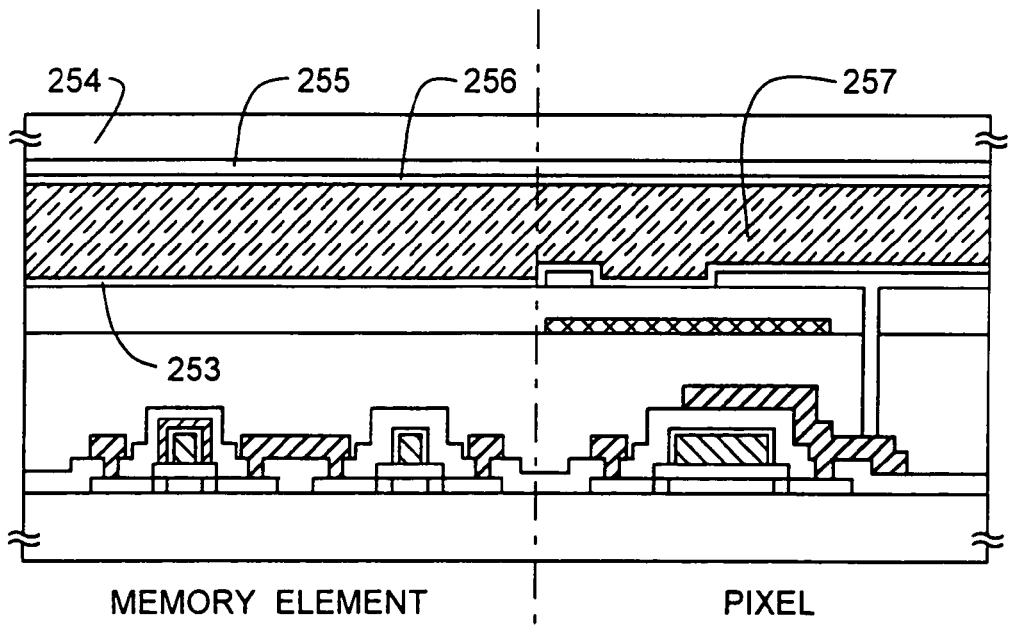

FIGS. 5A to 5C are referred. Contact holes are formed in the interlayer insulating film 242, and then source-electrodes 243, 244 and 245 and drain electrodes 246 and 247 are formed to obtain the state shown in FIG. 5A.

A second interlayer insulating film 249 composed of an organic resin film is formed in a thickness of from 0.5 to 3 µm as shown in FIG. 5B. As the organic resin film, polyimide, acryl, polyamide and polyimideamide resins may be used. The advantages of using the organic resin film as the second interlayer insulating film 249 include (1) easiness of film formation, (2) easiness of thickening of the film thickness, (3) low parasitic capacitance due to low relative dielectric constant, and (4) excellent flatness.

A black mask 250 is then formed as shown in FIG. 5B.

A third interlayer insulating film 251 composed of one of a silicon oxide film, a silicon nitride film and an organic resin film, or a laminated film of them is formed in a thickness of from 0.1 to 0.3 µm. A contact hole is formed in the third interlayer insulating film 251, a pixel electrode 252 is formed by patterning the thus-formed conductive film. Since the Example exemplifies a transmission liquid crystal display device, a transparent conductive film such as ITO is used as the conductive film constituting the pixel electrode 252.

In the constitution shown in FIG. 5B, an auxiliary capacitance is formed in the region in which the pixel electrode 252 and the black mask 250 overlap each other via the interlayer insulating film 251.

In the constitution shown in FIG. 5B, the auxiliary capacitance, which is liable to occupy a large area, can be formed on the TFT to prevent reduction in aperture ratio. Furthermore, by using a silicon nitride film having a high dielectric constant in a suitable thickness, an extremely high capacitance can be obtained with a small area.

The whole substrate is heated in a hydrogen atmosphere at 350° C. for from 1 to 2 hours to hydrogenate the whole element, so that the dangling bonds (unpaired bonds) in the films (particularly in the active layers) are compensated. According to the procedures described above, a CMOS circuit and a pixel matrix circuit can be provided on the same substrate.

Referring to FIG. 5C, a process for producing a liquid crystal panel using the active matrix substrate prepared in the above procedures is explained.

An oriented film 253 is formed on the active matrix substrate in the state shown in FIG. 5B. In the Example, polyimide was used as the oriented film 253. A counter substrate composed of a glass substrate 254, a transparent conductive film 255 and an oriented film 256 is prepared.

In the Example, a polyimide film was used as the oriented film by which the liquid crystal molecules are oriented in parallel to the substrate. After forming the oriented film, a rubbing treatment is conducted to make the liquid crystal molecules oriented in parallel with a constant pretilted angle.

A black mask, a color filter and the like are provided in the counter substrate if necessary, which are omitted herein.

The active matrix substrate and the counter substrate thus prepared are laminated with each other through a sealing material or a spacer (not shown) according to the known process for cell assembling. A liquid crystal material 257 is then filled between the both substrates and completely sealed with a sealant (not shown). A transmission liquid crystal panel shown in FIG. 5C is thus obtained.

In the Example, the liquid crystal panel displays in a TN mode. Therefore, one pair of polarizing plates (not shown) are arranged in such a manner that the polarizing plates sandwich the liquid crystal panel as crossnicol (a state in which one pair of polarizing plates are arranged so that the polarizing axes lie at right angles to each other).

Therefore, in the Example, the display is realized in a normally white mode in which light is transmitted when a voltage is not applied to the pixel TFT of the liquid crystal panel.

Figure 6:
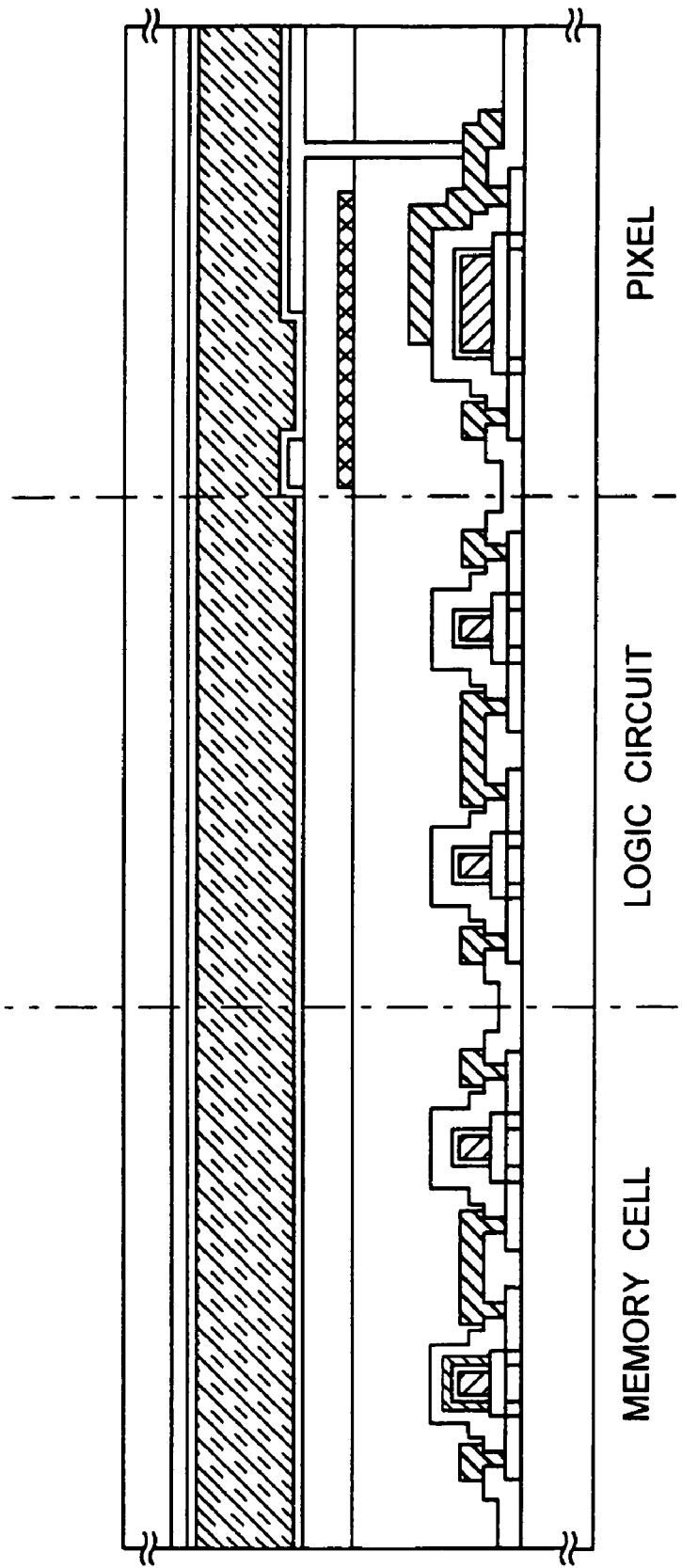
FIG. 6 is a cross sectional view of a liquid crystal display device containing a non-volatile memory of the invention.

FIG. 6 shows a state in which a memory cell including an FAMOS TFT, a pixel TFT and a logic circuit are integrated on the same substrate.

Figure 7A:
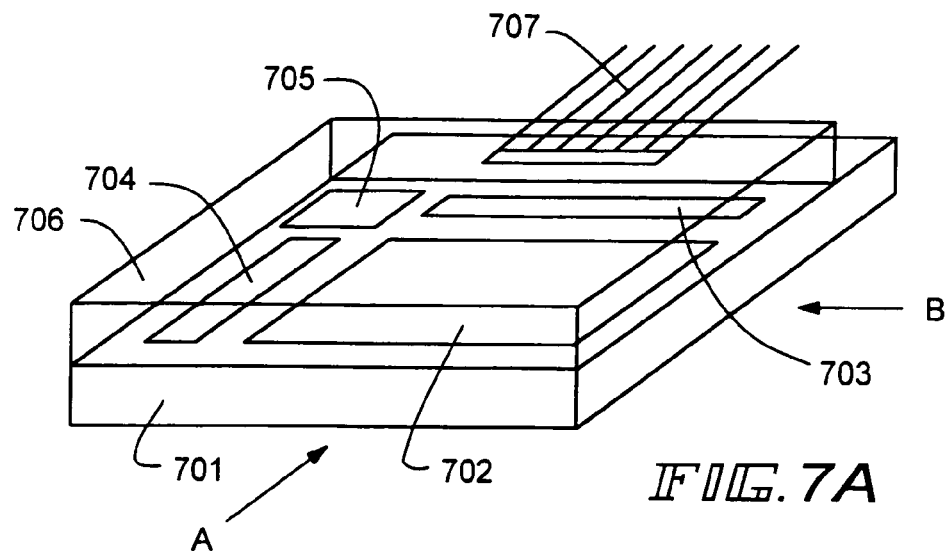
FIGS. 7A to 7C are a perspective view and cross sectional views of a liquid crystal display device containing a non-volatile memory of the invention.
Figure 7B:
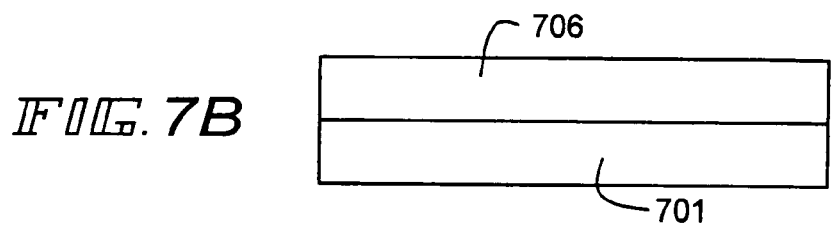
Figure 7C:
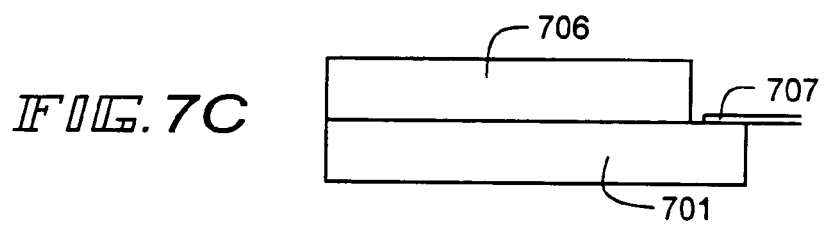

Schematic views of the appearance of the liquid crystal panel of the Example are shown in FIGS. 7A to 7C, in which numeral 701 denotes a quartz substrate, 702 denotes a pixel matrix circuit, 703 denotes a driver circuit on a source signal line side, 704 denotes a driver circuit on a gate signal line side, and 705 denotes a logic circuit, such as a signal processing circuit, and a non-volatile memory circuit. Numeral 706 denotes a counter substrate and 707 denotes an FPC (flexible print circuit) terminal. In general, what is called a liquid crystal module is a liquid crystal panel equipped with an FPC.

While the logic circuit 705 encompasses all the logic circuits composed of TFTs in a broad sense, the logic circuit 705 used herein designates circuits other than those conventionally called a pixel matrix circuit and a driver circuit to distinguish from them.

In the non-volatile memory of the Example, data for making gamma correction to image signals is stored. The data is inherent in respective liquid crystal display device and stored in the non-volatile memory on preparation of the gamma correction data after production.

In the case where Si is used for the floating gate and/or the control gate of the FAMOS TFT used in the non-volatile memory, the non-volatile memory has the same structure as the peripheral circuits and the logic circuits, and thus the invention can be applied.

In the non-volatile memory in the Example, the control gate electrode is formed via the non-porous anodic oxidized film formed on the preparation of the floating gate electrode.

Figure 8:
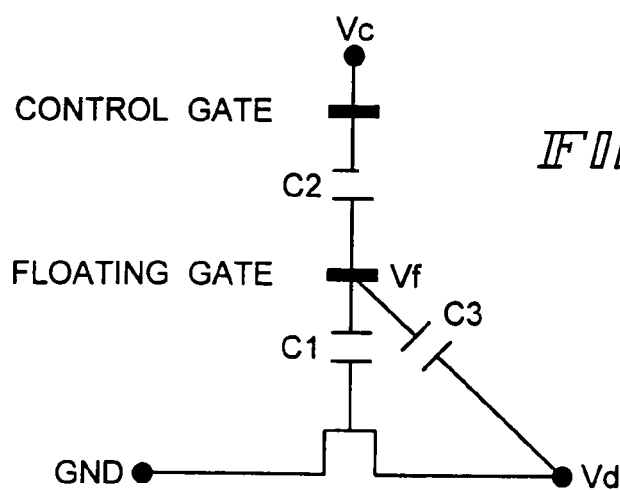
FIG. 8 is a diagram showing capacitances of a non-volatile memory of the invention.

Referring to FIG. 8, when the capacitance between the control gate electrode and the floating gate electrode is represented by C2, the capacitance between the floating gate electrode and the active layer is represented by C1, the gate voltage is represented by Vc, the drain voltage is represented by Vd, and the source is grounded, a capacitance dividing voltage Vf generates at the floating gate electrode. Vf can be represented by the following equation.

$$Vf = \frac{C2Vc + C3Vd}{C1 + C2 + C3}$$

In the Example, since the capacitance C3 between the floating gate and the control gate is large, carriers are liable to be injected into the floating gate electrode.

Example 2

The production process of a control gate electrode of an FAMOS TFT in this Example is different from that in Example 1. Since the other processes are the same as in Example 1, they are omitted but referred to Example 1. In a liquid crystal display device of the Example, a non-volatile memory of the Example is used for storing gamma correction data. CMOS circuits which are typically used as peripheral circuits such as a driver circuit can be produced in the similar processes. A production process of a circuit of a P-channel TFT and an N-channel TFT each having one gate electrode is explained in the Example, but a circuit of a double gate type having plural gate electrodes can also be produced in the similar processes.

Figure 9A:
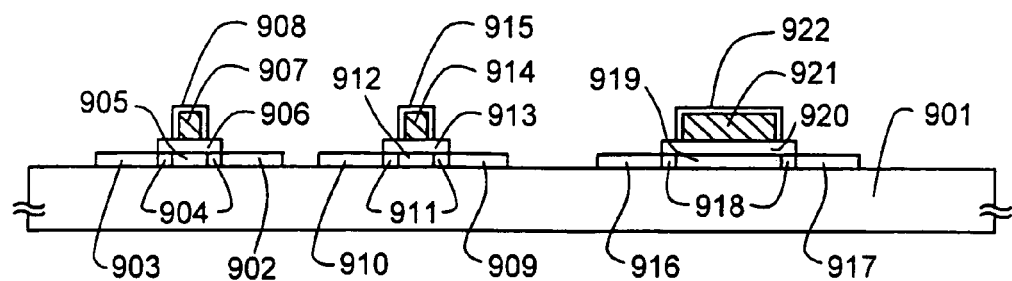
FIGS. 9A to 9C are diagrammatic illustrations showing a production process of a liquid crystal display device containing a non-volatile memory of the invention.
Figure 9B:
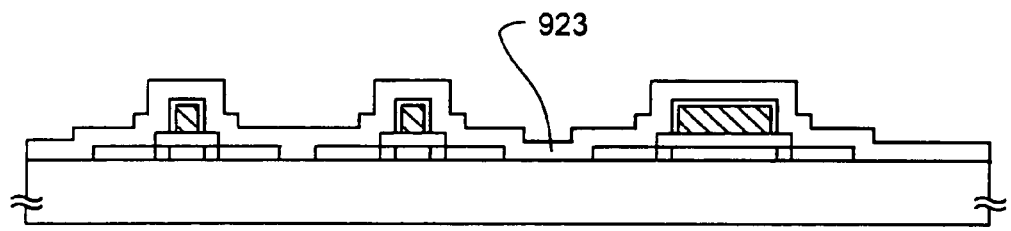
Figure 9C:
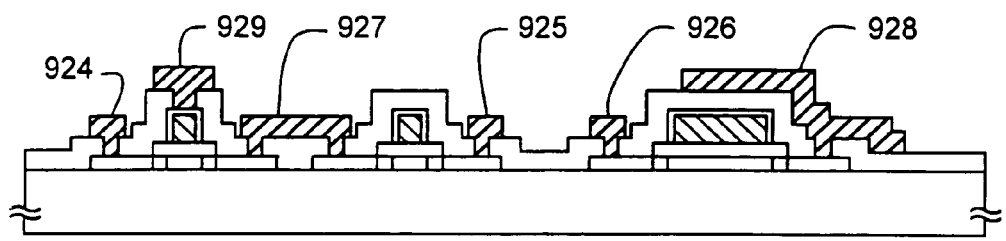

FIGS. 9A to 9C are referred. FIG. 9A shows a state corresponding to the state after completion of the step of FIG. 4B in Example 1. For steps before FIG. 9A, Example 1 can be referred to. In FIG. 9A, numeral 901 denotes a base substrate. Numeral 903 denotes a source region, 902 denotes a drain region, 904 denotes a low concentration impurity region, 905 denotes a channel forming region, 906 denotes a gate insulating film, 907 denotes a floating gate electrode, and 908 denotes a non-porous anodic oxidized film of a P-channel FAMOS TFT. Numeral 909 denotes a source region, 910 denotes a drain region, 911 denotes a low concentration impurity region, 912 denotes a channel forming region, 913 denotes a gate insulating film, 914 denotes a gate electrode, and 915 denotes a non-porous anodic oxidized film of an N-channel TFT. Numeral 916 denotes a source region, 917 denotes a drain region, 918 denotes a low concentration impurity region, 919 denotes a channel forming region, 920 denotes a gate insulating film, 921 denotes a gate electrode, and 922 denotes a non-porous anodic oxidized film of an N-channel TFT constituting a pixel TFT.

A laminated film of a silicon oxide film and a silicon nitride film is formed as an interlayer insulating film 923 as shown in FIG. 9B.

As shown in FIG. 9C, after forming contact holes in the interlayer insulating film 923, source electrodes 924, 925 and 926, drain electrodes 927 and 928, and a control gate electrode 929 of a P-channel FAMOS TFT are formed.

The control gate electrode of the P-channel FAMOS TFT is connected to the non-porous anodic oxidized film 908.

The second interlayer insulating film (not shown) composed of an organic resin film is then formed according to the procedures of Example 1. The steps after that are also conducted according to the procedure of Example 1.

According to the processes in the Example, a liquid crystal display device having a non-volatile memory containing FAMOS TFT can be produced without increase in production steps.

Example 3

FIGS. 21A to 21E are referred. FIGS. 21A to 21E show the change of the gate leak current IG depending on the change of the first dose amount of boron in the TFT produced in Example 1. VD denotes the drain voltage, ID denotes the drain current, and VG represents the gate voltage.

FIGS. 21A to 21E and FIG. 23B show graphs where the first dose amount of boron is changed from 0 (None) to $6\times10^{13}$ (6E 13) atoms/cm$^3$. The gate leak current has a peak value (denoted by IG(peak)). It is understood from these graphs that when the first dose amount of boron is increased, the peak value of the gate leak current becomes large. Therefore, the gate leak current is increased when the low concentration impurity region is not present, and thus carriers are liable to be injected into the floating gate electrode.

Figure 23A:
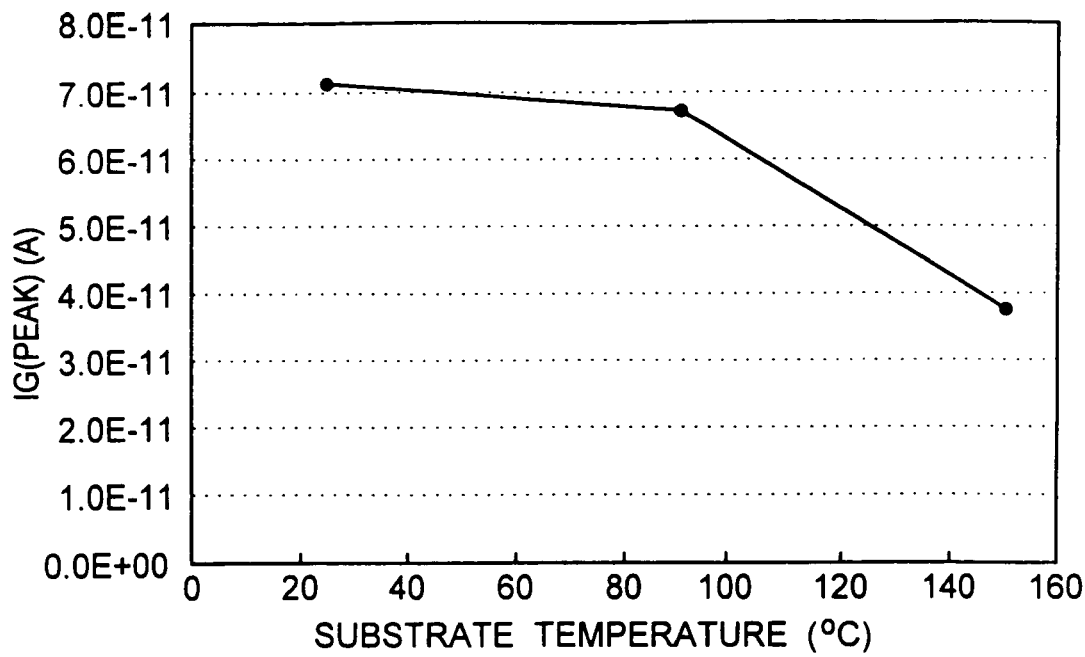
FIGS. 23A and 23B are graphs showing measurement results of characteristics of a TFT.
Figure 23B:
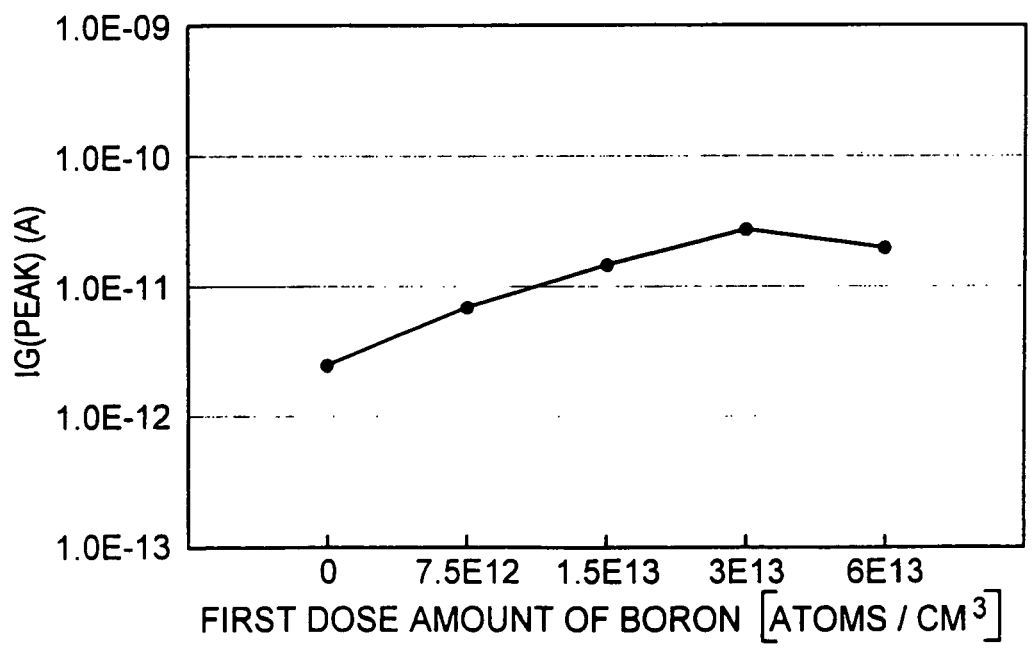

FIG. 23B shows the relationship between the first dose amount of boron and the peak of the gate leak current.

In the Example, in view of the fact that the gate leak current becomes large when the first dose amount of boron is large, a low concentration impurity region is not provided in the FAMOS TFT.

The addition step of impurity ions of the FAMOS TFT in the Example is different from Example 1. In a liquid crystal display device of the Example, a non-volatile memory of the Example is used for storing gamma correction data. CMOS circuits which are typically used as peripheral circuits such as a driver circuit can be produced in the similar processes.

Figure 10A:
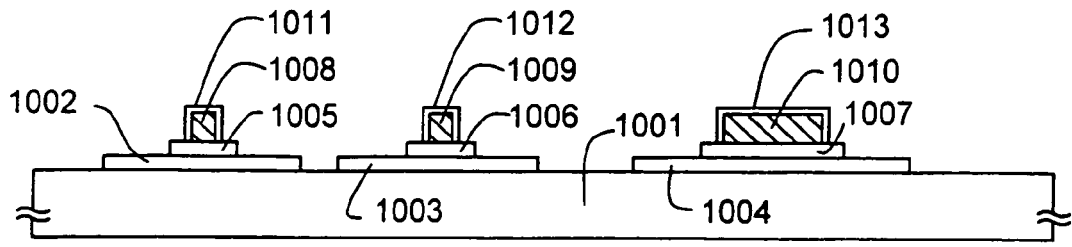
FIGS. 10A to 10D are diagrammatic illustrations showing a production process of a liquid crystal display device containing a non-volatile memory of the invention.
Figure 10B:
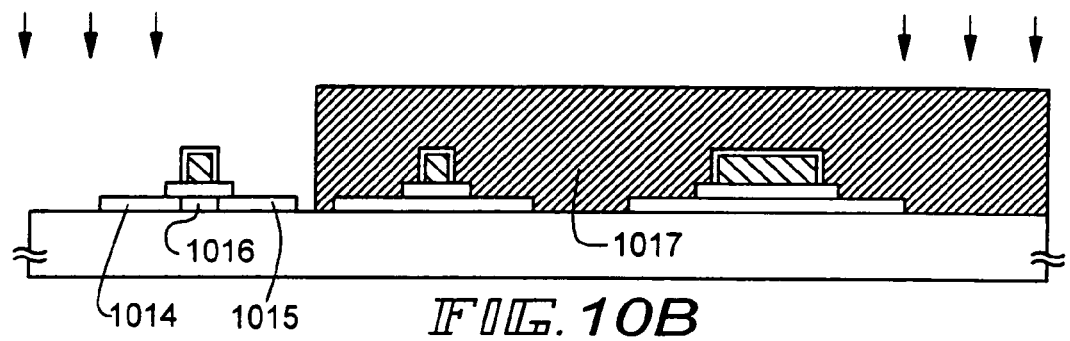

FIGS. 10A to 10D are referred. FIG. 10A shows a state corresponding to the state after completion of the step of FIG. 3D (formation of a floating gate) in Example 1. For steps before FIG. 9A, Example 1 can be referred to.

In FIG. 10A, numeral 1001 denotes a base substrate, 1002, 1003 and 1004 denote semiconductor layers (active layers) in an island form, 1005, 1006 and 1007 denote gate insulating films, 1008, 1009 and 1010 denote gate electrodes (provided that 1008 denotes a floating gate of an FAMOS TFT), and 1011, 1012 and 1013 denote non-porous anodic oxidized films.

Addition of the impurity is conducted for an FAMOS TFT. While B (boron) is used as the impurity in the Example, Ga and In may also be used. The addition of the impurity is conducted at an acceleration voltage of about 80 keV to form a source region 1014, a drain region 1015 and a channel forming region 1016. At this time, a resist mask 1017 is formed in the other region than the desired region, so that the addition of the impurity is not effected on the other region.

In the Example, the addition of the impurity is conducted as divided into two steps. In the first step, the addition of an impurity (P (phosphorous) in the Example) is conducted at a high acceleration voltage of about 80 keV to form an n$^-$ region after forming a resist mask 1018. In the n$^-$ region, the P ion concentration is controlled to $1\times10^{18}$ atoms/cm$^3$ to $1\times10^{19}$ atoms/cm$^3$.

In the second step, the addition of the impurity is conducted at a low acceleration voltage of about 10 keV to form an n$^+$ region. In this addition, the gate insulating film functions as a mask because of the low acceleration voltage. In the n$^+$ region, the sheet resistance is controlled to 500 Ω or less (preferably 300 Ω or less).

Throughout the above procedures, a source region 1019, a drain region 1020, a low concentration impurity region 1021 and a channel forming region 1022 of an N-type TFT are prepared. A source region 1023, a drain region 1024, a low concentration impurity region 1025 and a channel forming region 1026 of an N-type TFT constituting the pixel TFT are fixed. The state until this step is shown in FIG. 10C.

Figure 10C:
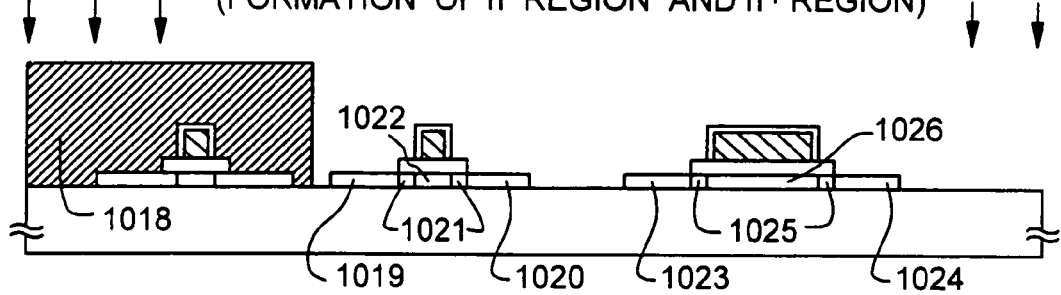

In the state shown in FIG. 10C, the active layer of the P-type TFT has the same constitution as the active layer of the N-type TFT.

Figure 10D:
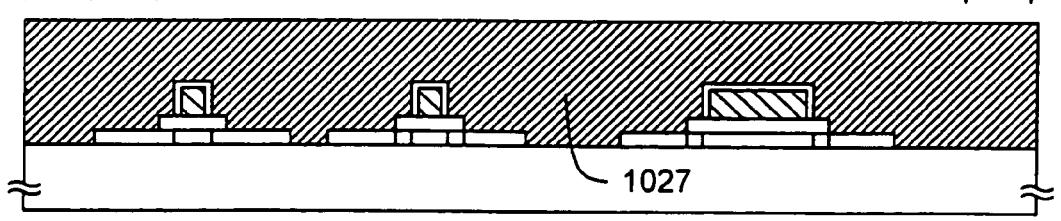

As shown in FIG. 10D, a resist mask 1027 is provided covering the N-type TFT, and addition of an impurity ion giving P-type (boron in the Example) is conducted. In FIG. 10D, P-channel TFTs other than the FAMOS TFT are not shown.

This addition process is also conducted as divided into two steps as similar to the previous step of impurity addition. It is required in this process to invert N-type to P-type, B (boron) ions are added in a concentration higher by several times the concentration of the P-type ion previously added.

Thus, the source region, the drain region, the low concentration impurity region and the channel forming region of the P-type TFT are formed. The state until this step is shown in FIG. 10D.

After completing the formation of the active layer, activation of the impurity ions is conducted by the combination of furnace annealing, laser annealing and lamp annealing. At the same time, damage of the active layer suffered in the addition processes is restored.

Figure 11A:
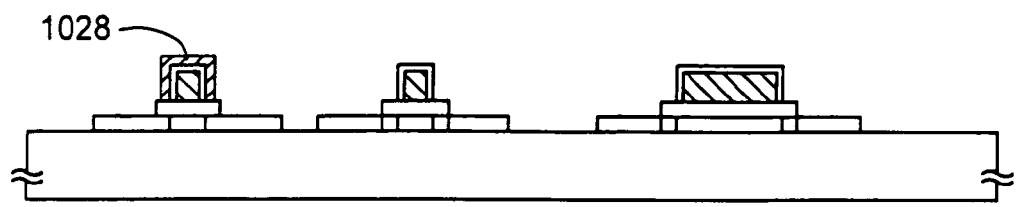
FIGS. 11A to 11C are diagrammatic illustrations showing a production process of a liquid crystal display device containing a non-volatile memory of the invention.

A control gate electrode 1028 of a P-channel FAMOS TFT is prepared. The control gate electrode 1028 is formed in such a manner that it surrounds the non-porous anodic oxidized film 1011 as shown in FIG. 11A. Therefore, insulation between the control gate electrode 1028 and the floating gate electrode 1008 is maintained.

Figure 11B:
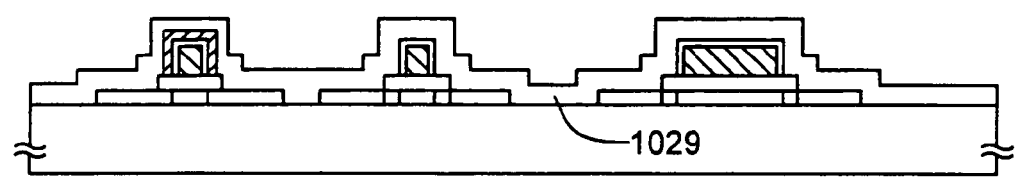

A laminated film of a silicon oxide film and a silicon nitride film is formed as an interlayer insulating film 1029 as shown in FIG. 11B.

Figure 11C:
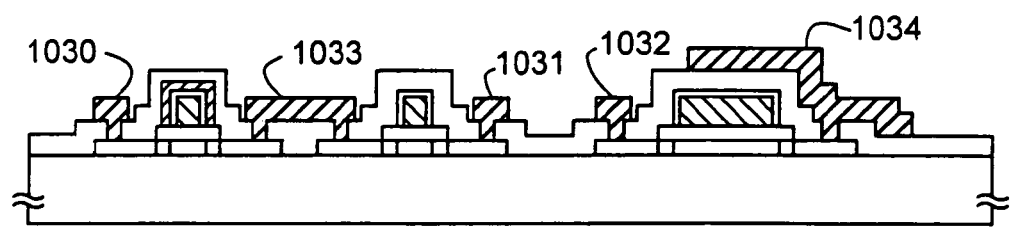

After forming contact holes in the interlayer insulating film 1029, source electrodes 1030, 1031 and 1032, and drain electrodes 1033 and 1034 are formed, to obtain the state shown in FIG. 11C.

After this step, the steps shown in FIG. 5B and later of Example 1 are then conducted.

Figure 12:
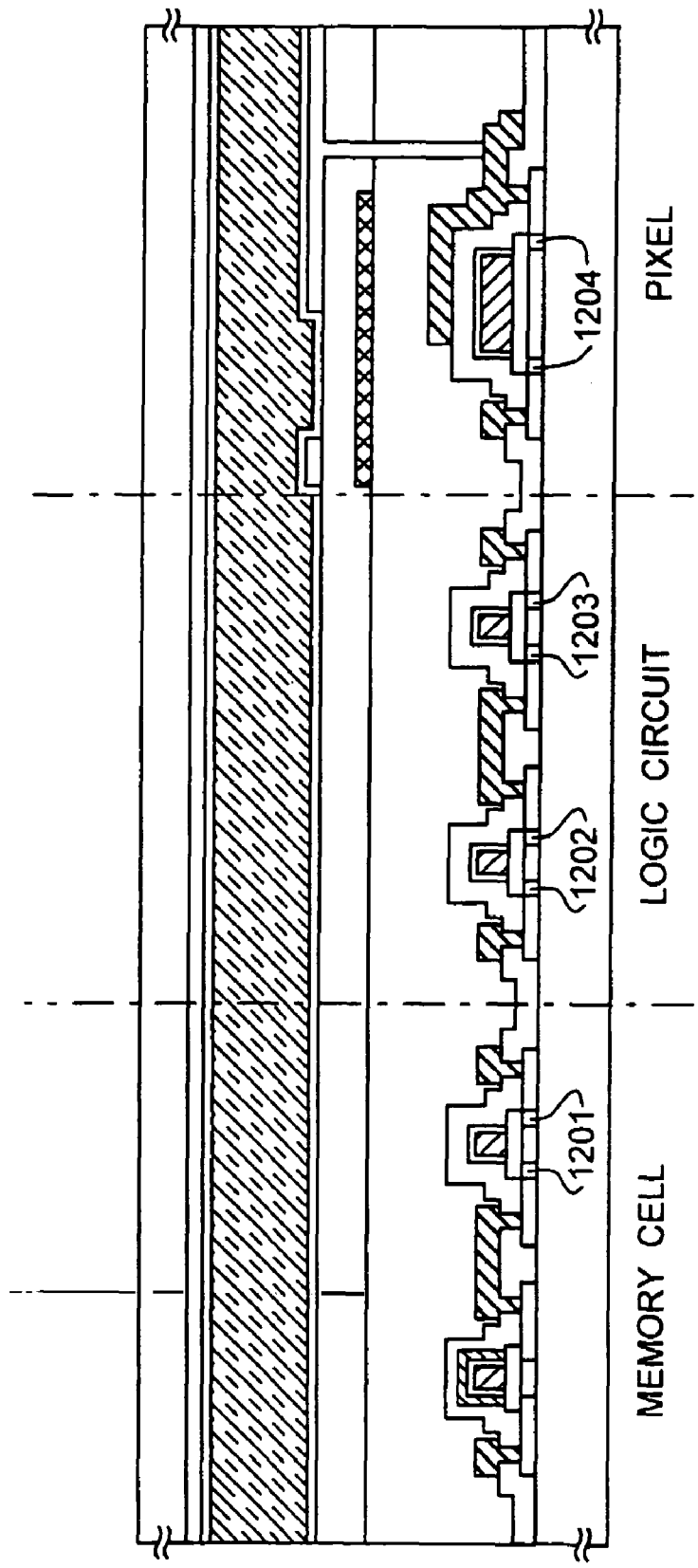
FIG. 12 is a cross sectional view of a liquid crystal display device containing a non-volatile memory of the invention.

A cross sectional view of the liquid crystal panel of the Example is shown in FIG. 12, in which a memory cell including the FAMOS TFT, a pixel TFT and a logic circuit are integrated on the same substrate. As the logic circuit, a CMOS circuit is shown as representative, as similar to Example 1.

As shown in FIG. 12, a low concentration impurity region is not formed in the semiconductor active layer of the P-channel FAMOS TFT of the memory cell, whereas the low concentration impurity regions 1201, 1202, 1203 and 1204 are formed in the other TFTs. Therefore, carrier injection is liable to occur into the floating gate electrode to realize excellent function of memory.

Example 4

In this Example, both an FAMOS TFT and a switching TFT constituting a memory cell are prepared as a P-channel TFT. TFTs constituting a decoder of memory and other logic circuits are prepared as an N-channel TFT and a P-channel TFT. For all the steps omitted from explanation in the Example, the procedures as in Example 1 can be referred to.

FIGS. 13A to 13D are referred. A quartz substrate 1301 is prepared as a substrate having an insulating surface. A silicon substrate having a thermal oxidized film on the surface can be used instead of the quartz substrate. Furthermore, a substrate can be obtained by forming an amorphous silicon film on a quartz substrate, and then thermally oxidizing the film completely. A quartz substrate or a ceramics substrate having a silicon nitride film as an insulating film can also be used.

Numeral 1302 denotes an amorphous silicon film, which is controlled to have a final thickness (thickness considering the thinning after thermal oxidation) of from 10 to 100 nm, preferably from 20 to 80 nm. By controlling to such a final thickness, impact ionization is liable to occur in an FAMOS TFT, and the injection of carrier into the floating gate is liable to occur. It is important to carefully control the impurity concentration of the film upon formation of the film. The thickness of the amorphous silicon film of the FAMOS TFT may be from 10 to 400 nm and that of other TFTs may be from 20 to 80 nm. In these cases, the desired thickness can be obtained by a selective oxidation process.

In the Example, the concentrations of C (carbon), N (nitrogen), O (oxygen) and S (sulfur), the representative impurities, in the amorphous silicon film 1302 are all controlled to less than $5\times10^{18}$ atoms/$cm^3$, preferably $1\times10^{18}$ atoms/$cm^3$ or less. In the case where these impurities are present in a concentration more than this value, they adversely affect on crystallization, which may be a reason of deterioration of the film quality after crystallization.

The hydrogen concentration of the amorphous silicon film 1302 is also an important factor. It is considered that a film having good crystallinity can be obtained by suppressing the hydrogen concentration. The amorphous silicon film 1302 is therefore preferably formed by the vacuum thermal CVD process. The plasma CVD process can also be employed by optimizing the film forming conditions.

The step of crystallization of the amorphous silicon film 1302 is then conducted. As means for crystallization, the technique described in Unexamined Published Japanese Patent Application No. 7-130652 is employed. While either the process in Example 1 or Example 2 of the publication may be employed, it is preferred in the Example to use the process of Example 2 of the publication, the technical contents of which are described in detail in Unexamined Published Japanese Patent Application No. 8-78329.

In the technique described in Unexamined Published Japanese Patent Application No. 8-78329, a mask insulating film 1303 is formed to select the region to which a catalytic element is added. The mask insulating film 1303 has plural openings for the addition of a catalytic element. The position of the crystallized region can be controlled by adjusting the position of the openings.

Figure 13A:
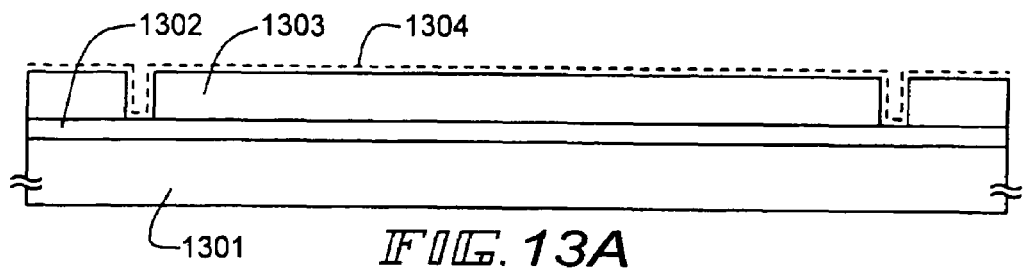
FIGS. 13A to 13D are diagrammatic illustrations showing a production process of a liquid crystal display device containing a non-volatile memory of the invention.

A solution containing nickel (Ni) as a catalytic element accelerating the crystallization of the amorphous silicon film 1302 is coated by a spin coating method to form an Ni-containing layer 1304. As a catalytic element, cobalt (Co), iron (Fe), palladium (Pd), platinum (Pt), copper (Cu), gold (Au) and germanium (Ge) can be used other than nickel. The state until this step is shown in FIG. 13A.

As the addition step of the catalytic element, an ion injection method or a plasma doping method using a resist mask. In these cases, it is easy to suppress the exclusive area of the addition region and to control the growing length of the crystal in the lateral growing region, and thus these technique is useful to produce a fine circuit.

After completing the addition step of the catalytic element, hydrogen is removed at 450° C. for about 1 hour, and crystallization of the amorphous silicon film 1302 is conducted by a heat treatment in an inert atmosphere, a hydrogen atmosphere or an oxygen atmosphere at a temperature of from 500 to 700° C., typically from 550 to 650° C., for from 4 to 24 hours. In the Example, a heat treatment is conducted in a nitrogen atmosphere at 570° C. for 14 hours.

Figure 13B:
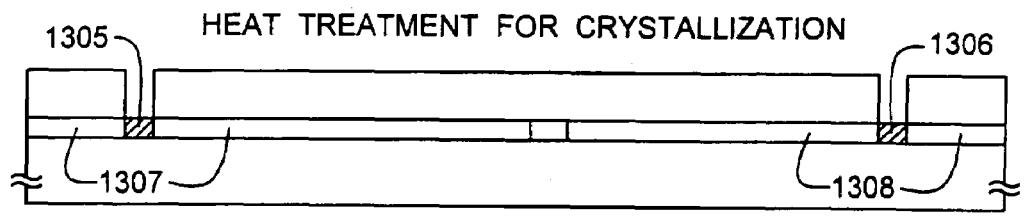

In this step, the crystallization of the amorphous silicon film 1302 dominantly proceeds at the regions 1305 and 1306, to which nickel is added, and crystalline regions 1307 and 1308 are formed, which grow in a direction substantially parallel to the substrate surface of the substrate 1301. The crystalline regions 1307 and 1308 are called lateral growing regions. Since the lateral growing region contains crystals that are accumulated in a relatively uniform state, it advantageously has excellent crystallinity. The state until this step is shown in FIG. 13B.

Figure 13C:
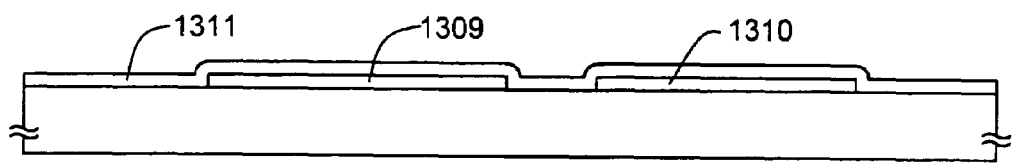

After completing the heat treatment for crystallization, the mask insulating film 1303 is removed, and patterning is conducted to form semiconductor layers (active layers) in an island form 1309 and 1310 formed from the lateral growing regions 1307 and 1308. The state until this step is shown in FIG. 13C.

Numeral 1309 denotes an active layer of a P-channel FAMOS TFT and a P-channel switching TFT, 1310 denotes an active layer of an N-type TFT (pixel TFT) constituting a pixel matrix circuit.

After providing the active layers 1309 and 1310, a gate insulating film 1311 composed of an insulating film containing silicon is provided on them. The thickness of the gate insulating film of the FAMOS TFT may be from 10 to 50 nm and that of other TFTs may be from 50 to 200 nm. $SiO_2$, SiON and SiN may be used as the gate insulating layer.

Figure 13D:
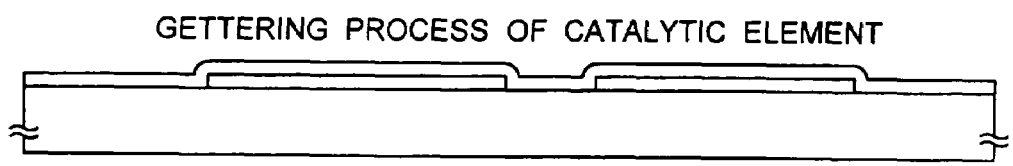

A heat treatment for removing or reducing the catalytic element (nickel) (gettering process of catalytic element) is then conducted as shown in FIG. 13D. In the heat treatment, a halogen element is added to the treatment atmosphere to utilize the gettering effect of metallic elements by the halogen element.

In order to sufficiently utilize the gettering effect of the halogen element, the heat treatment is preferably conducted at a temperature over 700° C. At temperatures below 700° C., decomposition of the halogen compound in the treatment atmosphere becomes difficult, and the gettering effect may not be obtained.

Thus the heat treatment in the Example is conducted at a temperature over 700° C., preferably from 800 to 1,000° C. (typically 950° C.), and the treating time is from 0.1 to 6 hours, typically from 0.5 to 1 hour.

This Example exemplifies the heat treatment that is conducted using an oxygen atmosphere containing from 0.5 to 10% by volume (3% by volume in the Example) of hydrogen chloride (HCl) at 950° C. for 30 minutes. When the HCl concentration is more than the above value, it is not preferred since unevenness occurs on the surface of the active layers 1309 and 1310.

While the case using HCl gas as a compound containing a halogen element is exemplified above, other gases, typically one or more selected from halogen-containing compound, e.g., HF, $NF_3$, HBr, $Cl_2$, $ClF_3$, $BCl_3$, $F_2$ and $Br_2$, may be used.

Furthermore, it is effective to conduct a heat treatment in a nitrogen atmosphere at 950° C. for about 1 hour to improve the film quality of the gate insulating film 1311, after completing the heat treatment in a halogen atmosphere.

It was confirmed by SIMS analysis that the halogen element used for gettering process was remained in the active layers 1309 and 1310 at a concentration of from $1\times10^{15}$ atoms/cm$^3$ to $1\times10^{20}$ atoms/cm$^3$. It was also confirmed by SIMS analysis that the halogen element is distributed in a high concentration between the active layers 1309 and 1310 and the thermal oxidation film formed by the heat treatment.

Furthermore, as a result of SIMS analysis for other elements, it was confirmed that the concentrations of the representative impurities, C (carbon), N (nitrogen), O (oxygen) and S (sulfur) were each less than $5\times10^{18}$ atoms/cm$^3$ (typically $1\times10^{18}$ atoms/cm$^3$ or less).

Figure 14A:
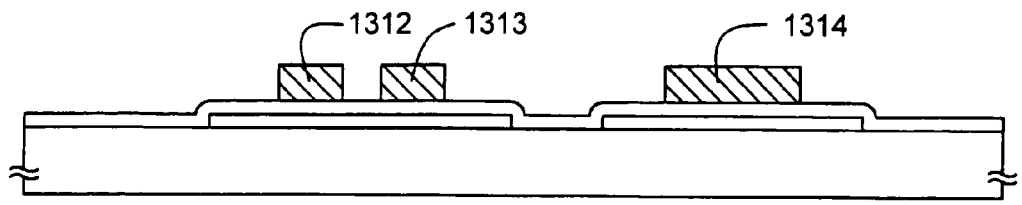
FIGS. 14A to 14D are diagrammatic illustrations showing a production process of a liquid crystal display device containing a non-volatile memory of the invention.

FIGS. 14A to 14D are referred. A metallic film (not shown in Figure) containing aluminum as a main component is formed and then subjected to patterning to produce bases 1312, 1313 and 1314 of gate electrodes formed later. An aluminum film containing 2% by weight of scandium is used in the Example. The state until this step is shown in FIG. 14A. A part of the base 1312 becomes a floating gate of a P-channel FAMOS TFT.

According to the technique described in Unexamined Published Japanese Patent Application No. 7-135318, porous anodic oxidized films 1315, 1316 and 1317, non-porous anodic oxidized films 1318, 1319 and 1320, and gate electrodes 1321, 1322 and 1323 are formed. The state until this step is shown in FIG. 14B.

Figure 14B:
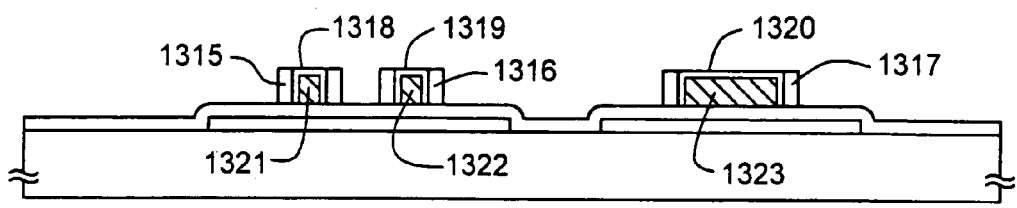
Figure 14C:
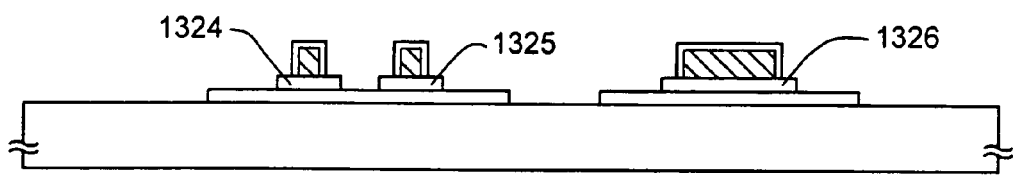

After obtained the state shown in FIG. 14B, the gate insulating film 1311 is etched by using the gate electrodes 1321, 1322 and 1323 and the porous anodic oxidized films 1315, 1316 and 1317 as a mask. The porous anodic films 1315, 1316 and 1317 are then removed to obtain the state shown in FIG. 14C. In FIG. 14C, numerals 1324, 1325 and 1326 denote the gate insulation film after processing.

Figure 14D:
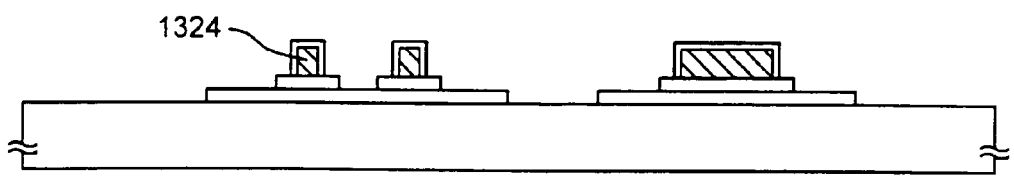

The gate electrode 1321 is then cut off to produce floating gate electrodes 1321'. The state until this step is shown in FIG. 14D.

FIGS. 15A to 15D are referred. Impurity elements giving one electro-conductivity are added. As the impurity elements, P (phosphorous) or As (arsenic) may be used for N-type and B (boron) may be used for P-type.

In the Example, the addition of the impurity is conducted as divided into two steps. In the first step, the addition of an impurity (P (phosphorous) in the Example) is conducted at a high acceleration voltage of about 80 keV to form an n$^-$ region. In the n$^-$ region, the P ion concentration is controlled to from $1\times10^{18}$ atoms/cm$^3$ to $1\times10^{19}$ atoms/cm$^3$.

In the second step, the addition of the impurity is conducted at a low acceleration voltage of about 10 keV to form an n$^+$ region. In this addition, the gate insulating film functions as a mask because of the low acceleration voltage. In the n$^+$ region, the sheet resistance is controlled to 500 Ω or less (preferably 300 Ω or less).

Throughout the above procedures, a source region, a drain region, a low concentration impurity region and a channel forming region (all of which are not shown in Figure) of an N-type TFT are prepared. A source region 1324, a drain region 1325, a low concentration impurity region 1326 and a channel forming region 1327 of an N-type TFT constituting the pixel TFT are fixed. The state until this step is shown in FIG. 15A.

Figure 15A:
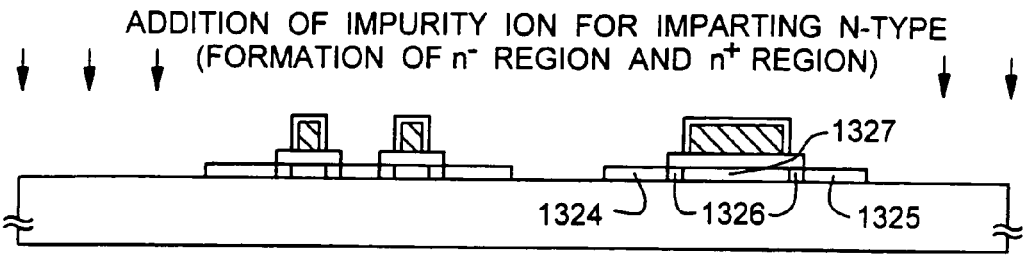
FIGS. 15A to 15D are diagrammatic illustrations showing a production process of a liquid crystal display device containing a non-volatile memory of the invention.

In the state shown in FIG. 15A, the active layer of P-type TFT and the active layer of N-type TFT have the same constitution.

Figure 15B:
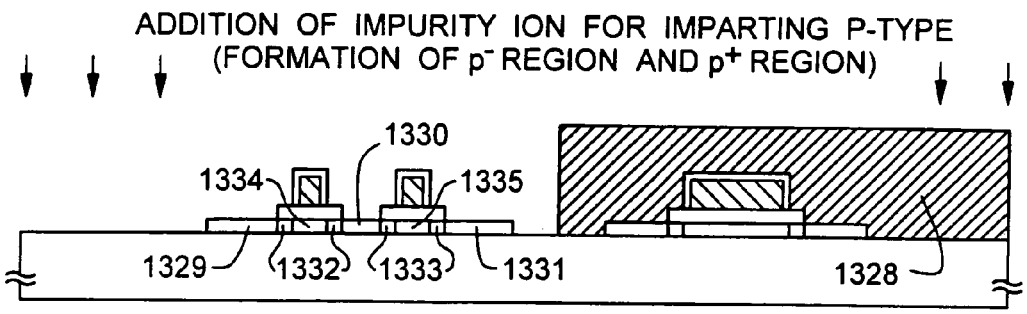

As shown in FIG. 15B, a resist mask 1328 is provided covering the N-type TFT, and addition of an impurity ion giving P-type (boron in the Example) is conducted.

This addition process is also conducted as divided into two steps as similar to the previous step of impurity addition. It is required in this process to invert N-type to P-type, B (boron) ions are added in a concentration higher by several times the concentration of the P-type ion previously added.

Thus, source and drain regions 1329, 1330 and 1331, low concentration impurity regions 1332 and 1333 and channel forming regions 1334 and 1335 of a P-type TFT are prepared. The state until this step is shown in FIG. 15B.

After completing the formation of the active layer, activation of the impurity ions is conducted by the combination of furnace annealing, laser annealing and lamp annealing. At the same time, damage of the active layer suffered in the addition processes is restored.

Figure 15C:
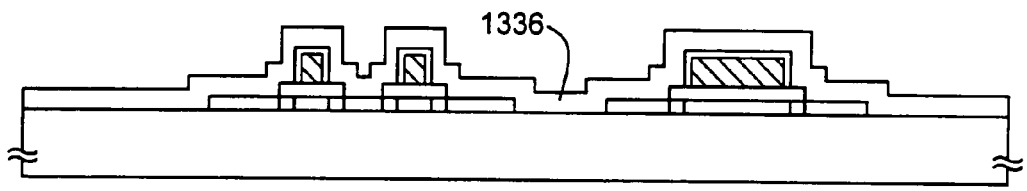
Figure 15D:
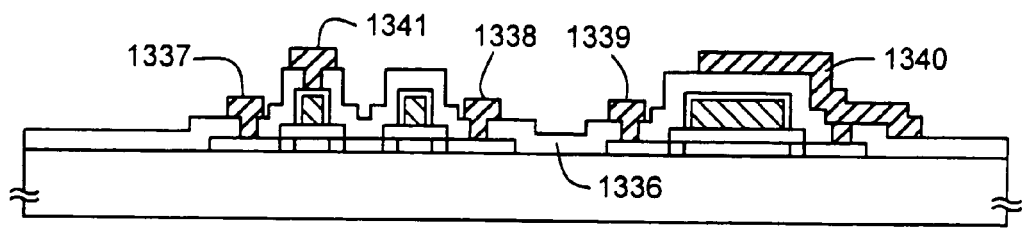

A laminated film of a silicon oxide film and a silicon nitride film is formed as an interlayer insulating film 1336 as shown in FIG. 15C.

Contact holes are formed in the interlayer insulating film 1336, and then source and drain electrodes 1337, 1338, 1339 and 1340, and a control gate electrode 1341 of the P-channel FAMOS TFT are formed.

The control gate electrode of the P-channel FAMOS TFT is connected to the upper surface of the non-porous anodic oxidized film 1318.

The second interlayer insulating film (not shown) composed of an organic resin film is then formed according to the procedures of Example 1. The steps after that are also conducted according to the procedure of Example 1.

Figure 16A:
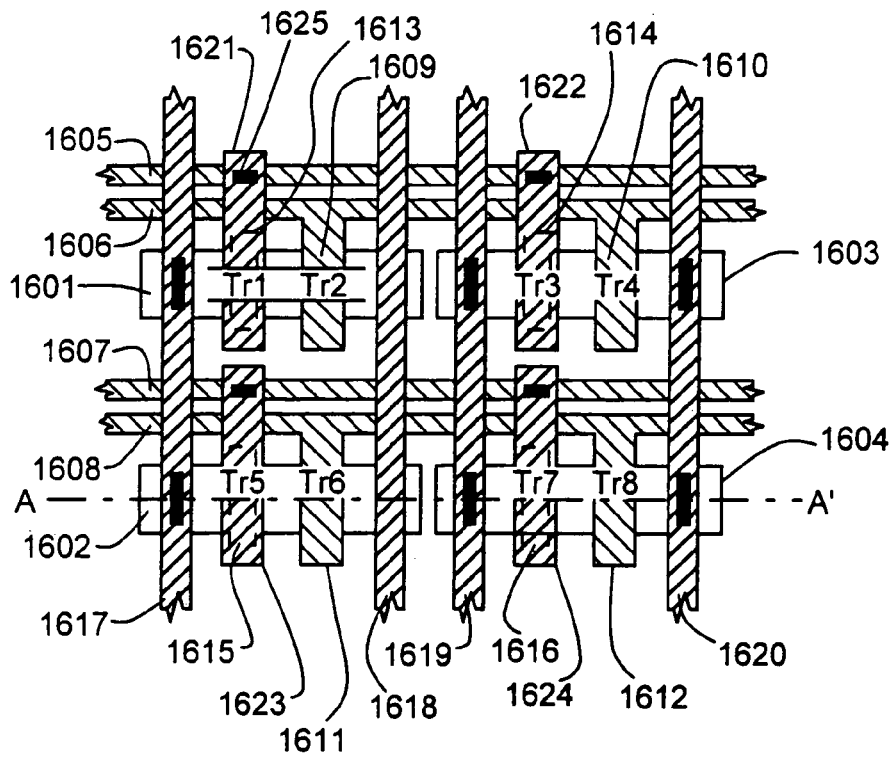
FIGS. 16A to 16C are circuit diagrams of a non-volatile memory according to the invention.
Figure 16B:
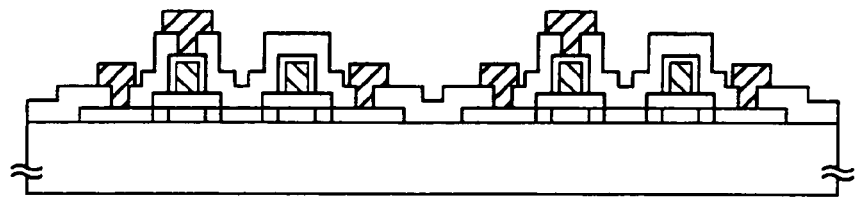
Figure 16C:
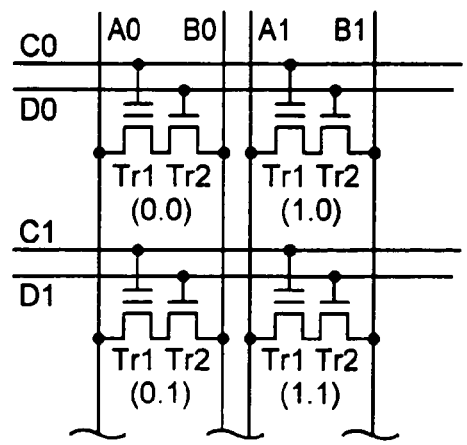

FIG. 16A shows a schematic circuit diagram of the non-volatile memory of the Example. FIG. 16B shows a cross sectional view taken on line A-A' of FIG. 16A. FIG. 16C shows a circuit diagram equivalent to FIG. 16A.

In FIG. 16A, numerals 1601 to 1604 denote semiconductor layers, which form TFTs Tr1 to Tr8. Numerals 1605 to 1608 denote first interconnect layers, which are used for the gate electrodes and the gate signal lines of Tr2, Tr4, Tr6 and Tr8, and the gate signal lines of Tr1, Tr3, Tr5 and Tr7. The floating gate electrodes 1613 to 1616 of Tr1, Tr3, Tr5 and Tr7 are formed simultaneously with the formation of the first interconnect layers, and are made into a floating state after patterning. Numerals 1609 to 1612 denote gate electrodes of Tr2, Tr4, Tr6 and Tr8. Numerals 1617 to 1624 denote second interconnect layers, which are used as signal lines connected to the source and drain regions of each Tr's, and as the control gate electrodes of Tr1, Tr3, Tr5 and Tr7. In FIG. 16A, parts painted over with black, such as that denoted by 1625, show that the interconnect layer is made in contact with the lower interconnect layer or semiconductor layer. In FIG. 16A, the interconnect layers having the same hatching pattern all belong to the same interconnect layer.

The operation of the non-volatile memory of the Example is explained by referring to FIG. 16C. The non-volatile memory of the Example has a structure in which memory cells are arranged in a matrix form as similar to Example 1. In FIG. 16C, symbols A0, B0, C0, D0, A1, B1, C1 and D1 are assigned to the signal lines. Symbols (0,0) to (1,1) are assigned to the memory cells. The operation of the memory cell (1,1) is explained as an example.

In the case where data is written in the memory cell (1,1), a high voltage of 50 V is applied to the signal line C1, and a voltage of −5V is applied to the signal line D1. The signal line B1 is then grounded, and a voltage of 5V is applied to A1. Electric charges are thus accumulated in the floating gate of Tr1. The electric charges accumulated in the floating gate of Tr1 are maintained.

In the case where data is read out from the memory cell (1,1), a voltage of 0 V is applied to the signal line C1, and a voltage of −5 V is applied to D1. The signal line B1 is then grounded, and the recorded signal is thus read out from A1.

The operation above are summarized in Table 2 below.

TABLE 2

|  | A1 (V) | B1 (V) | C1 (V) | D1 (V) |
| --- | --- | --- | --- | --- |
| Write in | 0 or −5 | GROUND | 50 | −5 |
| Read out |  | GROUND | 0 | −5 |

The data stored in the memory cells can be erased by irradiating the non-volatile memory with an X-ray, an ultraviolet ray or an electron beam, or by heating the non-volatile memory.

Example 5

In this Example, an EEPROM is explained, in which carriers accumulated in a memory can be erased electrically.

Figure 18A:
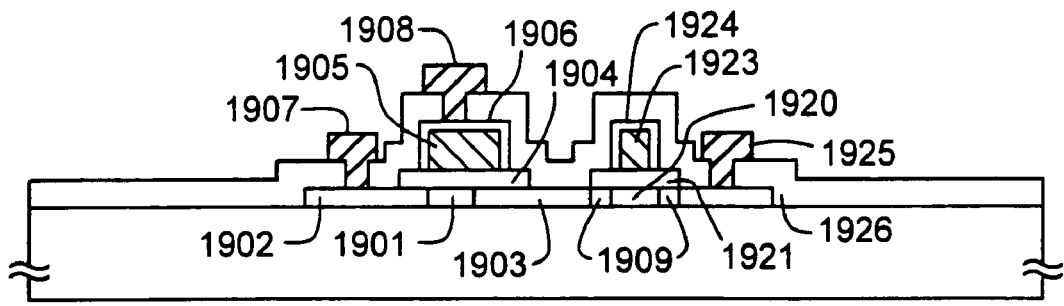
FIGS. 18A and 18B are a cross sectional view and a circuit diagram of a non-volatile memory according to the invention, respectively.
Figure 18B:
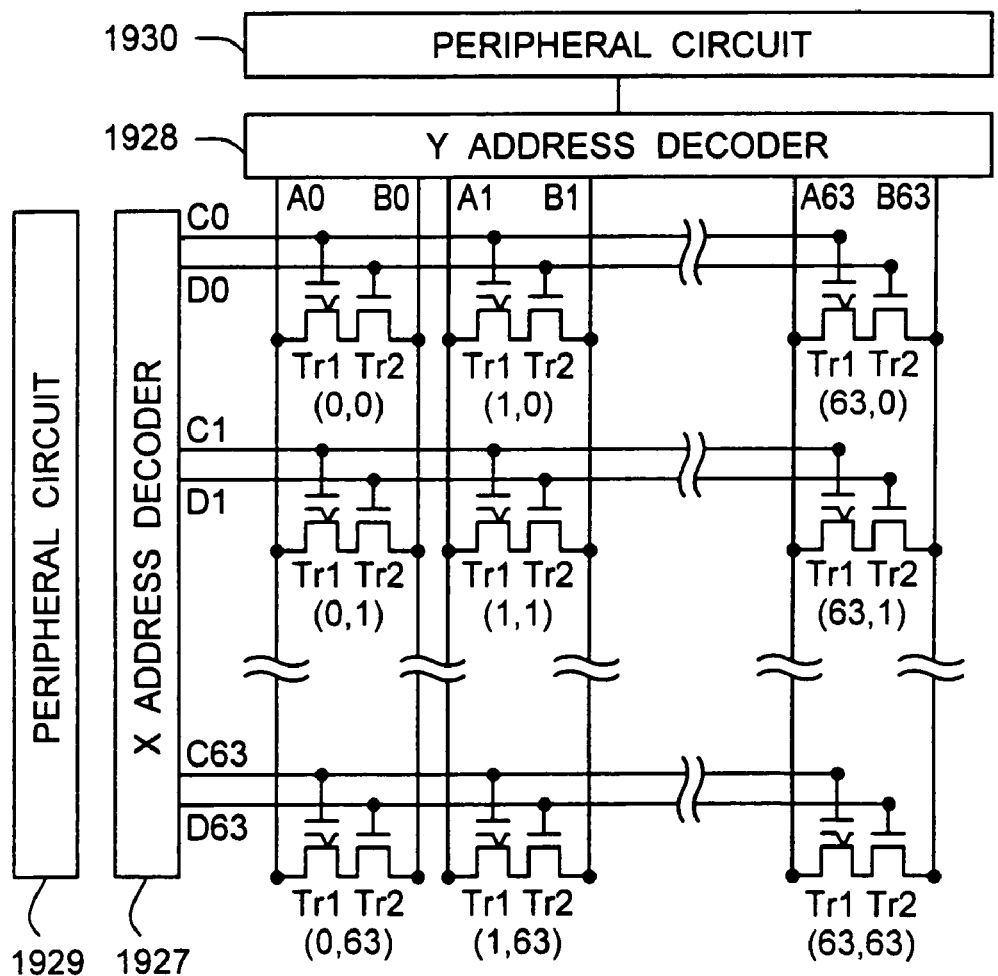
Figure 19:
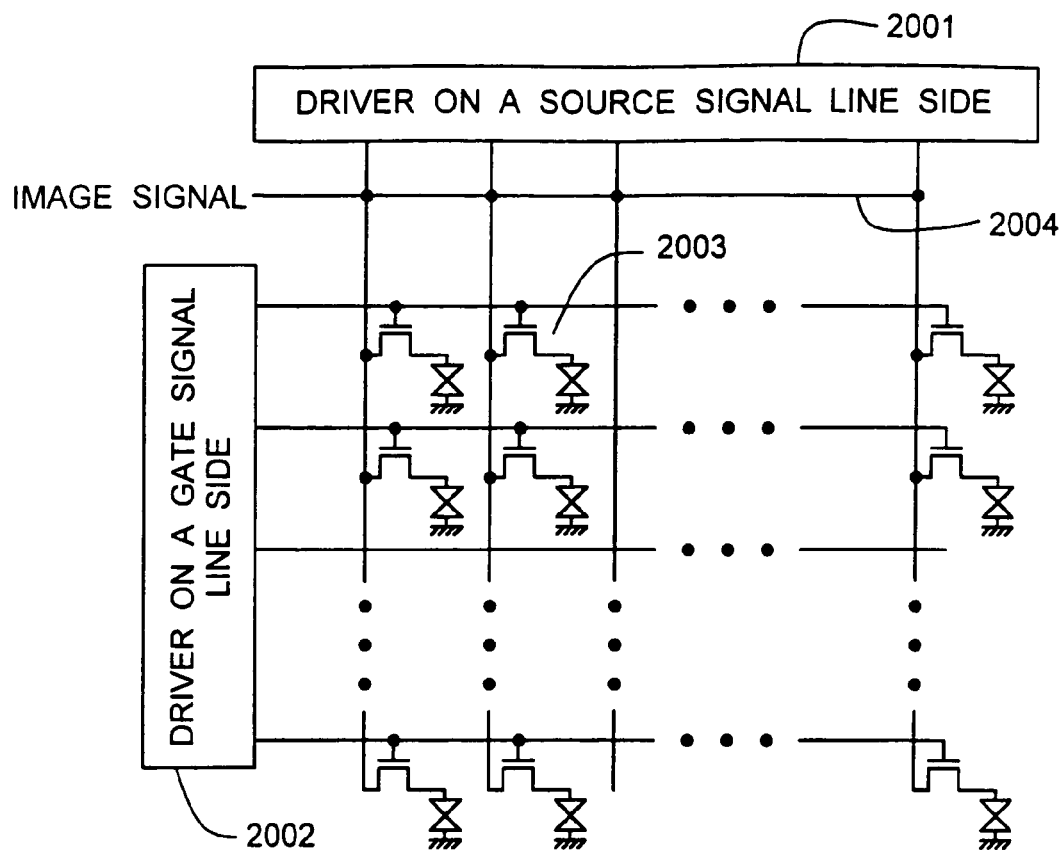
FIG. 19 is a diagram showing a conventional liquid crystal display device.
Figure 20:
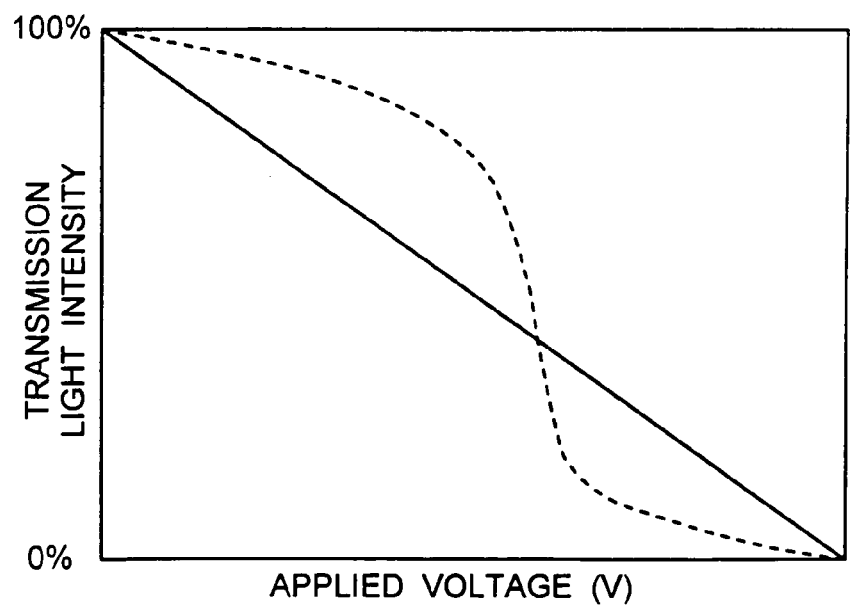
FIG. 20 is a graph showing a relationship between an applied voltage and a transmission light intensity of a liquid crystal display device.
Figure 21A:
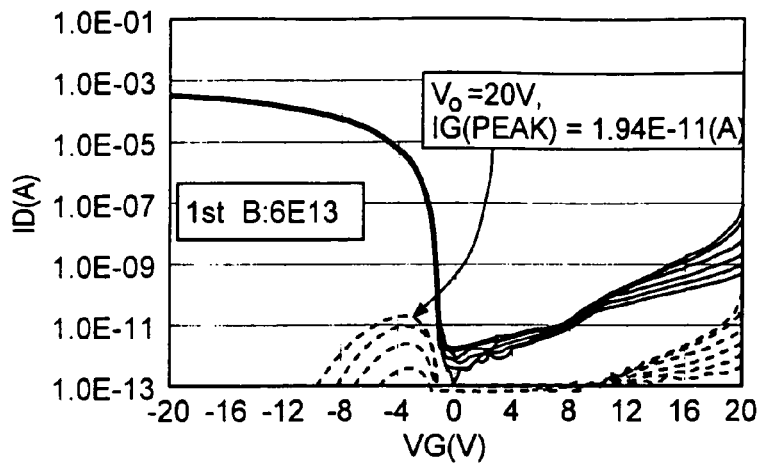
FIGS. 21A to 21C are graphs showing measurement results of characteristics of a TFT.
Figure 21B:
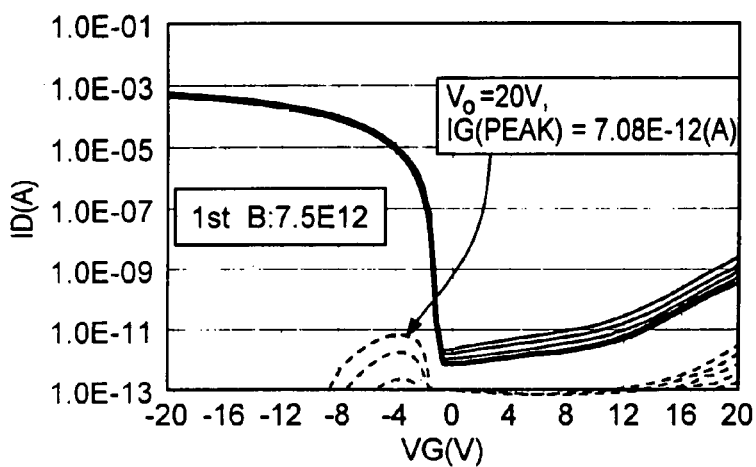
Figure 21C:
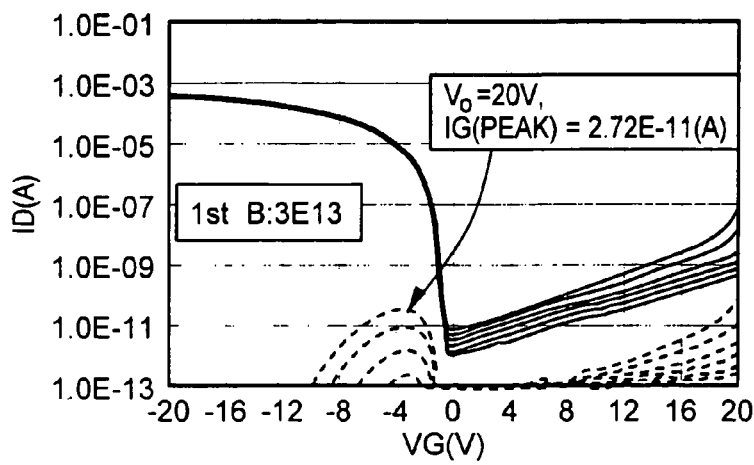
Figure 22A:
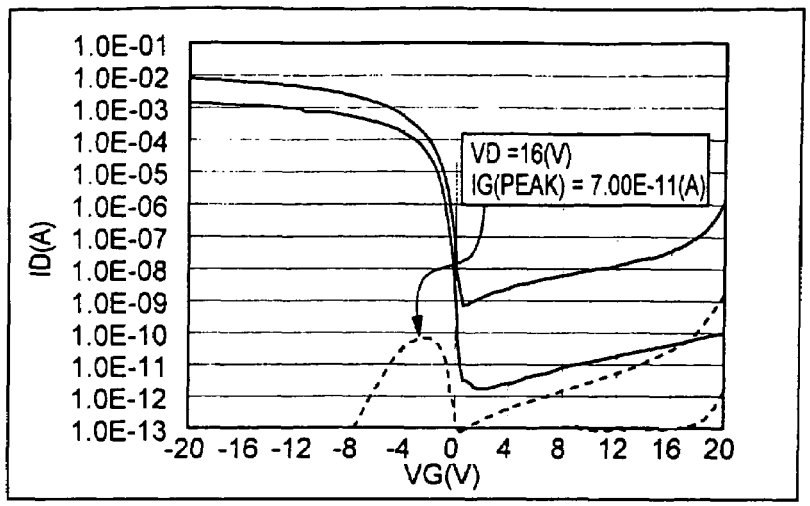
FIGS. 22A to 22C are graphs showing measurement results of characteristics of a TFT.
Figure 22B:
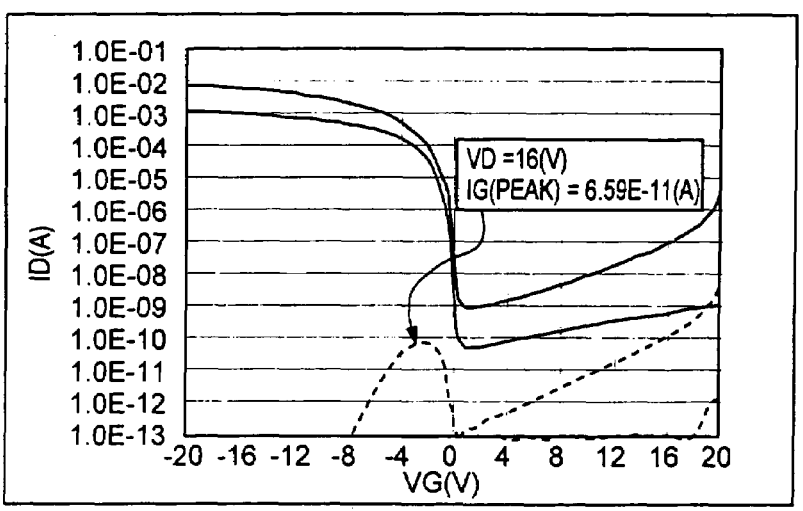
Figure 22C:
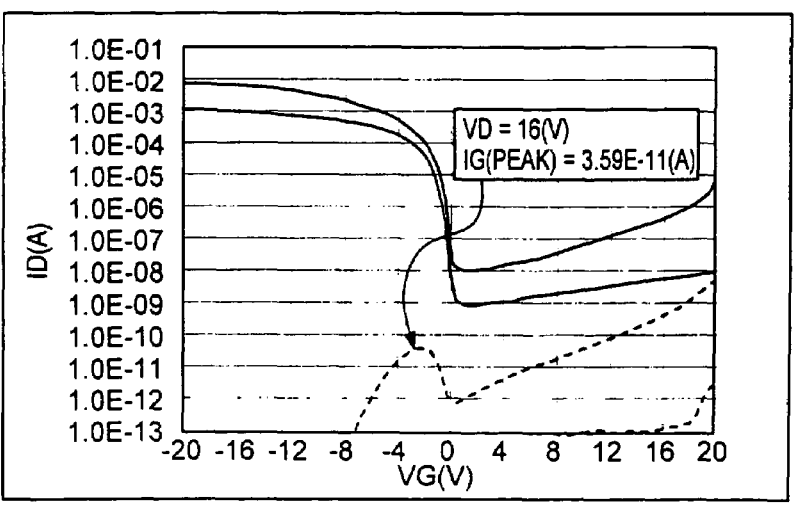

FIGS. 18A and 18B are referred. FIG. 18A shows a constitution of an EEPROM of the Example. Numeral 1901 denotes a channel region, 1902 and 1903 denote source and drain regions, 1904 denotes a gate insulating film, 1905 denotes a floating gate electrode, 1906 denotes an anodic oxidized film, 1907 denotes a source electrode and 1908 denotes a control electrode, of a P-type TFT. Numeral 1909 denotes a low concentration impurity region, 1920 denotes a channel region, 1921 denotes a gate insulating film, 1923 denotes a gate electrode, 1924 denotes an anodic oxidized film and 1926 denotes an interlayer film, of a switching TFT.

FIG. 18B shows a memory in which EEPROMs of the Example are arranged in a matrix form. Numerals 1927 and 1928 denote address decoders.

The operation of the memory of the Example is summarized in Table 3 below.

TABLE 3

|  | A1 (V) | B1 (V) | C1 (V) | D1 (V) |
| --- | --- | --- | --- | --- |
| Write in | 0 or −5 | GROUND | 50 | −5 |
| Read out |  | GROUND | 0 | −5 |
| Erase |  | GROUND | −50 | −5 |

The memory of the Example is used for a semiconductor display device as described in Examples 1 to 4.

Example 6

In this Example, a semiconductor display device similar to Example 1 is explained, provided that Ta (tantalum) or Ta alloy is used as a gate electrode.

By using Ta or Ta alloy in the gate electrode, it can be thermally oxidized at a temperature of from about 450° C. to about 600° C. to form an oxide film of good film quality composed of $Ta_2O_3$ on the gate electrode. It is found that this oxide film has better film quality than the oxide film formed by using Al (aluminum) as the gate electrode in Example 1.

The above is found from the fact that an oxide film of Ta or Ta alloy has better characteristics than an oxide film of Al in the J-E characteristics (current density-electric field intensity characteristics), which is one of the methods of withstand voltage evaluation for an insulating film.

The relative dielectric constant of $Ta_2O_3$ is about 11.6, and thus the capacitance C3 between the floating gate and the control gate is large (as referring to the equation in Example 1). Therefore, there is an advantage that electric charge is liable to be injected into the floating gate, in comparison to the case where Al is used as the gate electrode.

In the case where Ta is used as the gate electrode, it can also be subjected to anodic oxidation as similar to the preceding Examples.

In Examples 1 to 5, Ta or Ta alloy may be used as the gate electrode.

Example 7

The liquid crystal display devices described in Examples 1 to 6 are used in a semiconductor display device to which a liquid crystal display device is incorporated. Examples of the semiconductor device include a video camera, a still camera, a projection display, a head mounted display, a car navigation system, a personal computer and a portable information terminal (e.g., a portable computer and a cellular phone), some examples of which are shown in FIGS. 17A to 17E.

Figure 17A:
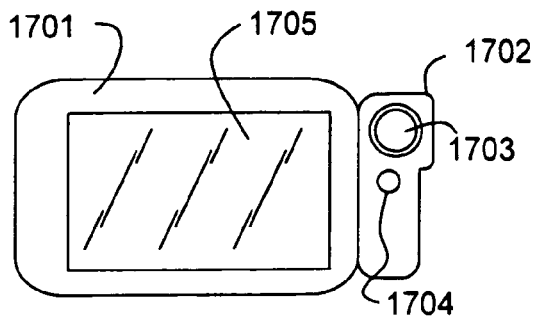
FIGS. 17A to 17E are schematic views of semiconductor devices using a non-volatile memory according to the invention.

FIG. 17A shows a portable computer, which is composed of a main body 1701, a camera part 1702, an image receiving part 1703, a operation switch 1704 and a liquid crystal display device 1705.

Figure 17B:
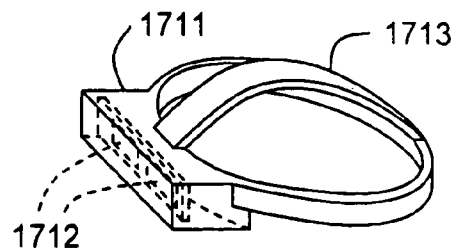

FIG. 17B shows a head mounting display, which is composed of a main body 1711, a liquid crystal display device 1712 and a belt part 1713.

Figure 17C:
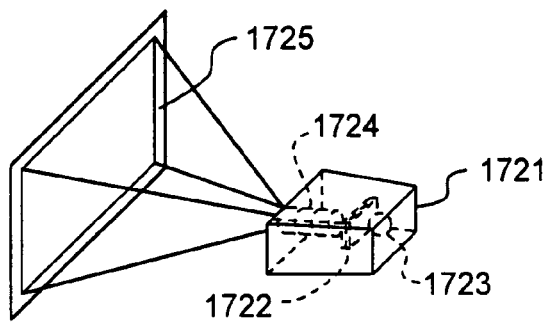

FIG. 17C shows a projection display of from projection type, which is composed of a main body 1721, a light source 1722, a liquid crystal display device 1723, an optical system 1724 and a screen 1725.

Figure 17D:
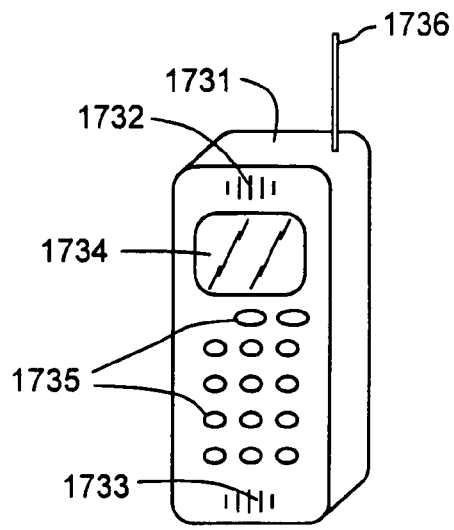

FIG. 17D shows a cellular phone, which is composed of a main body 1731, a sound output part 1732, a sound input part 1733, a liquid crystal display device 1734, an operation switch 1735 and an antenna 1736.

Figure 17E:
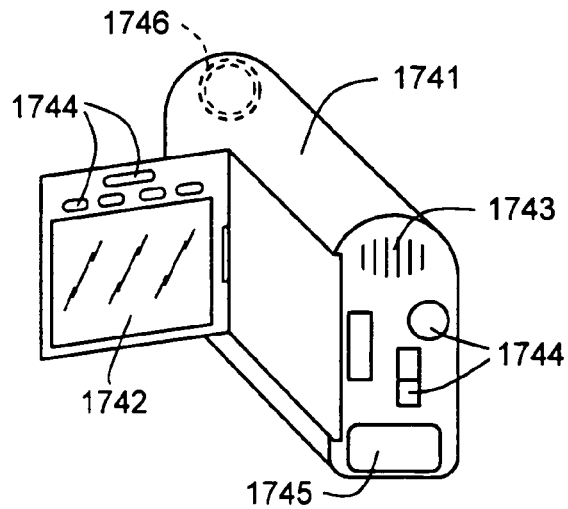

FIG. 17E shows a video camera, which is composed of a main body 1741, a liquid crystal display device 1742, a sound input part 1743, an operation switch 1744, a battery 1745 and an image receiving part 1746.

Example 8

In Examples 1 to 7 above, cases where a liquid crystal is used as a display media are explained. In the semiconductor display device of the invention, a mixed layer of a liquid crystal and a polymer, so as to be used as a polymer dispersion type liquid crystal display device. The invention may be used for any display devices equipped with any display media such as those in which the optical characteristics are modulated in response to the applied voltage. For example, the invention may be used in a display device using an electroluminescence element as a display medium. In these cases, the processes described in Example 1 can be used for the production of an active matrix substrate including a memory and peripheral circuits.

Tantalum and tantalum alloy may be used as the gate electrode as described in Example 6.

A semiconductor thin film produced by the production process of Examples 1 to 4 is explained. According to the production process of Examples 1 to 4, a crystalline silicon film called a continuous grain boundary crystalline silicon (so-called continuous grain silicon (CGS)) is obtained by crystallizing an amorphous silicon film.

The lateral growing region of the semiconductor thin film obtained by the production process of Examples 1 to 4 exhibits a peculiar crystalline structure composed of an aggregate of columnar or ellipsoidal columnar crystals. Its characteristics are shown below.

(Knowledge About Crystalline Structure of Active Layer)

The lateral growing region formed according to the production process of Examples 1 to 4 has, in a microscopic view, a crystalline structure in which plural columnar (or ellipsoidal columnar) crystals are regularly arranged in a particular direction where they are in substantially parallel to each other. This can be easily confirmed by the observation with TEM (transmission electron microscopy).

The inventors observed in detail the grain boundaries of crystals of the semiconductor thin film obtained by the process of Examples 1 to 4 with HR-TEM (high resolution transmission electron microscopy) at a magnification of 8,000,000 times. The result is shown in FIG. 24A. The grain boundaries of crystals used herein means grain boundaries formed at the interface at which the columnar crystals are in contact with each other, unless otherwise defined. Therefore, it is considered as distinguished from macroscopic grain boundaries such as those formed by meeting separate lateral growing regions.

The HR-TEM (high resolution transmission electron microscopy) is a method in which an electron beam is irradiated on a specimen in the perpendicular direction, the arrangement of atoms and molecules is evaluated by using interference of transmitted electrons and elastically scattered electrons. By using this method, the state of arrangement of the crystalline lattice can be observed as lattice stripes. Therefore, the bond state of atoms at the crystal grain boundaries can be expected by observing the crystal grain boundaries.

In the TEM photograph (FIG. 24A) obtained by the inventors, the state was clearly observed in which two different crystal grains (columnar crystal grains) were in contact with each other at their crystal grain boundaries. At this time, it was confirmed by electron beam diffractiometory that the two crystal grains were substantially in {110} orientation though there was some deviation.

In the above-described observation of lattice stripes by TEM photographs, lattice stripes corresponding to the {111} plane were observed in the {110} plane. The lattice stripes corresponding to the {111} plane herein means such lattice stripes that when the crystal grain is cut along the lattice stripes, the {111} plane appears. Which lattice stripes correspond to which plane can be facilely confirmed by the distance between the lattice stripes.

As a result of detailed observation of TEM photographs of the semiconductor thin films obtained by the production processes of Examples 1 to 4, a very interesting knowledge was obtained. Lattice stripes corresponding to the {111} plane were observed in both the two crystal grains appearing in the photograph, and the lattice stripes in both the crystal grains clearly ran in parallel to each other.

Furthermore, irrespective of the presence of the crystal grain boundary, the lattice stripes of the two different crystal grains were connected to each other across the crystal grain boundary. It was observed that most of the lattice stripes observed as across the crystal grain boundary were linearly continuous irrespective of the fact that they belonged to the different crystal grains. This phenomenon was observed at arbitrary crystal grain boundaries, and 90% or more (typically 95% or more) of lattice stripes maintained continuity at the crystal grain boundaries.

This type of crystalline structure (more correctly structure of crystal grain boundary) shows that the two different crystal grains are connected at the crystal grain boundary with extremely high coordination. The crystal lattice continuously ranges at the crystal grain boundary to form a structure in that a trap level due to a crystal defect is very difficult to be produced. In other words, the crystal lattice has continuity at the crystal grain boundary.

As shown in FIG. 24B, the inventors conducted, as a reference, electron beam diffractiometory and HR-TEM observation for a conventional polycrystalline silicon film (so-called high temperature polysilicon film). As a result, in two different crystal grains, lattice stripes of each grains ran in directions different from each other, and there was substantially no crystal grain boundary at which the lattice stripes continued with high coordination. There were many interruptions of lattice stripes at the crystal grain boundary, and it was found that there were many crystal defects. In such regions, unpaired bonds are present, and there is high possibility that they prevent migration of carriers as a trap level.

The inventors call the bond state of atoms where the lattice stripes continue with high coordination as in the semiconductor films obtained by the production processes in Examples 1 to 4 as a "coordinated bond". On the other hand, they call the bond state of atoms where the lattice stripes do not continue with high coordination as in the conventional polycrystalline silicon film as a "non-coordinated bond" (or "unpaired bond").

In the semiconductor thin film used in the invention, the coordination at the crystal grain boundary is extremely excellent, and the number of the non-coordinated bonds is extremely small. As a result of the observation of arbitrary plural crystal grain boundaries by the inventors, it was found that the ratio of non-coordinated bonds based on the total bonds was 10% or less (preferably 5% or less, more preferably 3% or less). In other words, 90% or more (preferably 95% or more, more preferably 97% or more) of the bonds are coordinated bonds.

Figure 25A:
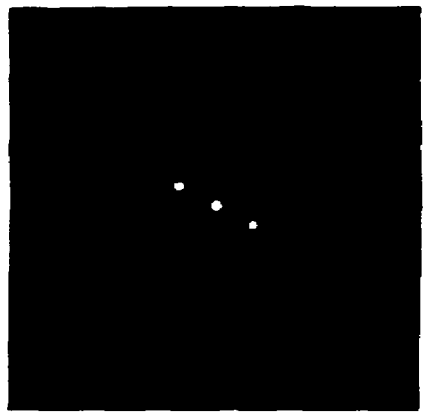
FIGS. 25A to 25C are photographs and a schematic illustration of electron beam diffractiometry.
Figure 25B:

A result of the electron beam diffractiometry of the lateral growing regions produced according to the production processes of Examples 1 to 4 is shown in FIG. 25A. FIG. 25B is an electron beam diffraction pattern of a conventional polysilicon film (called a high temperature polysilicon film) observed for reference.

Because the observations in FIGS. 25A and 25B were conducted with a diameter of an electron beam irradiation spot of 1.35 μm, information of the sufficiently macroscopic region in comparison to the lattice stripes was reflected in the observations.

Figure 25C:
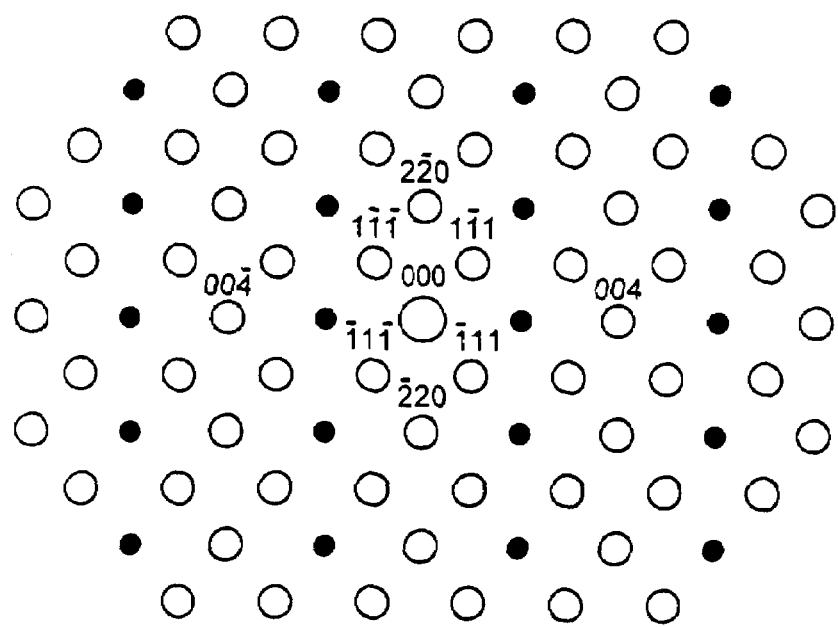

FIG. 25C is an electron beam diffraction pattern obtained by irradiating an electron beam to single crystal silicon in the direction perpendicular to the {110} plane of the single crystal silicon. Generally, the orientation characteristics of a specimen are estimated from the comparison between the diffraction pattern of the single crystal and that of the specimen.

In FIG. 25A, diffraction spots corresponding to the <110> incidence were relatively clearly observed, and it was confirmed that the crystal axis was the <110> axis, i.e., the crystal plane was the {110} plane.

There was observed slight concentric circular broadening in the respective spots. It was considered that there was some distribution of rotation angles around the crystal axis. The extent of the broadening is 5° or less as estimated from the pattern.

In the large number of observations, there were cases where a part of diffraction spots were not observed. (In FIG. 25A, a part of diffraction spots were not observed.) It is considered that although the orientation is substantially the {110} orientation, a part of diffraction pattern was not observed due to slight divergence of the crystal axis.

Based on the fact that the {111} plane substantially must be contained in the crystal plane, the inventors estimated that the divergence of rotation angles around the <111> axis is a reason of that phenomenon.

In the electron beam diffraction pattern shown in FIG. 25B, on the other hand, no clear regularity was observed in the diffraction spots, and it was confirmed that there was random orientation. In other words, crystals of plane azimuth other than the {110} plane are irregularly present as a mixture.

As understood from these results, the characteristic features of the crystalline silicon film of the invention reside in that substantially all crystal grains are oriented in the {110} plane, and the crystalline lattice has continuity at the crystal grain boundaries. These characteristic features are not found in conventional polysilicon film.

As described above, the semiconductor thin films produced by the production processes of Examples 1 to 4 are semiconductor thin films having a crystalline structure (more correctly structure of crystal grain boundary) entirely different from that of conventional semiconductor thin films. The inventors also describe the analytical results of the semiconductor thin film used in the invention in Japanese Patent Application No. 9-55633, No. 9-165216 and No. 9-212428.

The inventors conducted X-ray diffractiometory according to the method described in Unexamined Published Japanese Patent Application No. 7-321339, and calculated the orientation ratio for the crystalline silicon film obtained by the above-described production processes. In this published application, the orientation ratio is defined by the following equation.

{220} orientation existence ratio=1 (constant)

{111} orientation existence ratio=(relative intensity of {111} to {220} of specimen)/(relative intensity of {111} to {220} of powder)

{311} orientation existence ratio=(relative intensity of {311} to {220} of specimen)/(relative intensity of {311} to {220} of powder)

{220} orientation ratio=(({220} orientation existence ratio)/[{220} orientation existence ratio)+{111} orientation existence ratio)+{311} orientation existence ratio)]

Figure 28:
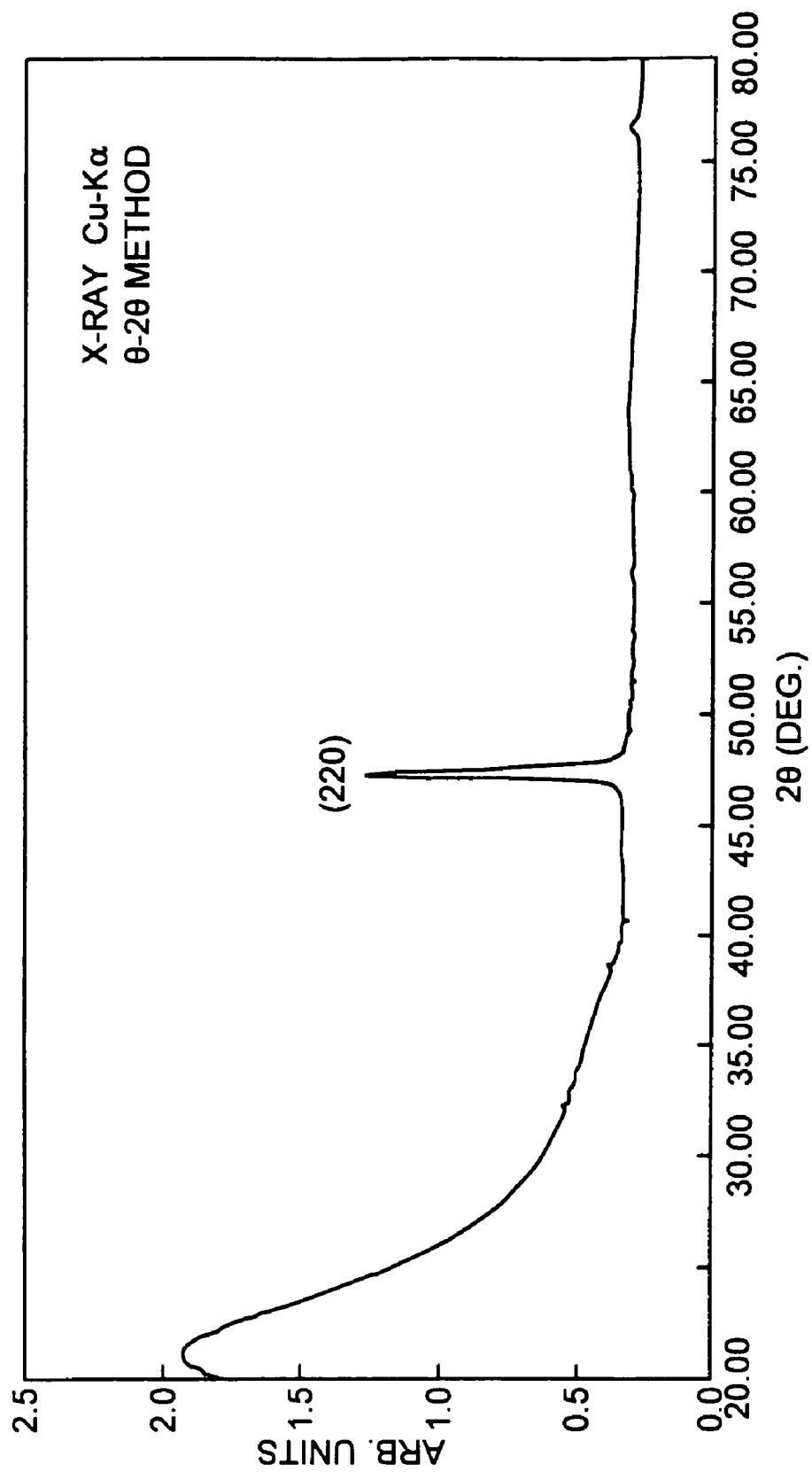
FIG. 28 is a graph showing a result of X-ray diffractiometory.

One example of a result of measurement the orientation characteristics of the semiconductor thin film by X-ray diffractiometory is shown in FIG. 28. A peak corresponding to the (220) plane appears in the X-ray diffraction pattern, which is of course equivalent to the {110} plane. As a result of the measurement, it was found that the {110} plane was the major orientation and the orientation ratio was 0.7 or more (typically 0.9 or more).

As shown in the foregoing, it is understood that the crystalline silicon film produced by the production processes of Examples 1 to 4 has a crystalline structure (crystalline constitution) entirely different from that of conventional polysilicon films. It can be understood from this point of view that the crystalline silicon film of the invention is a novel semiconductor film.

In the production of the semiconductor film of the invention, the annealing step at a temperature higher than the crystallization temperature exhibits an important role with respect to the reduction in defects in the crystal grains, which is then explained below.

Figure 26A:
FIGS. 26A and 26B are TEM photographs showing crystal grains of crystalline silicon films.

FIG. 26A is a TEM photograph of the crystalline silicon film after the crystallization step in Examples 1 to 4 at a magnification of 250,000. In the crystal grain (the black part and the white part appear due to the difference in contrast), defects pointed by the arrows are observed in a zigzag form.

The defects are mainly stacking faults where the stacking order of atoms deviates, but also include dislocation. It is considered that what appears in FIG. 26A is a stacking fault having a defect plane parallel to the {111} plane, which can be estimated from the defects in a zigzag form are folded at an angle of about 70°.

Figure 26B:

FIG. 26B is a TEM photograph at the same magnification of the crystalline silicon films finally produced by the production processes of Examples 1 to 4. There is observed substantially no effect due to stacking faults or dislocation in the crystal grain, and it is confirmed to have very high crystallinity. The same tendency can be applied to the whole film. Although it is currently difficult to completely avoid any defect, it can be reduced to the level that there is substantially no defect.

Accordingly, the crystalline silicon film shown in FIG. 26B can be considered as a single crystal or a substantially single crystal because the defect in the crystal grains is reduced to the level of substantially none, and the crystal grain boundaries do not become a barrier of carrier migration owing to the high continuity at the crystal grain boundaries.

While the crystalline silicon films shown in FIGS. 26A and 26B have the continuity at the crystal grain boundaries at the similar level, there is a great difference in the number of defects in the crystal grains. It is considered that the reason why the crystalline silicon films finally produced by the production processes of Examples 1 to 4 have far higher electric characteristics than the crystalline silicon film shown in FIG. 26A greatly resides in the difference in the number of defects.

The crystalline silicon films produced by the production processes of Examples 1 to 4 shown in FIG. 26B have a characteristic feature in that they have a number of defect far smaller than that of the crystalline silicon film shown in FIG. 26A which has been subjected to only crystallization.

The difference in the number of defects is reflected to the difference in the spin density in electron spin resonance (ESR) analysis. It has been found that the spin density of the crystalline silicon films produced by the production processes of Examples 1 to 4 is $5 \times 10^{17}$ spins/cm$^3$ or less (preferably $3 \times 10^{17}$ spins/cm$^3$). However, because this value of spin density is close to the lower detection limit of the currently available measurement device, the actual spin density is considered to be lower than this value.

The inventors call the crystalline silicon films produced by the production processes of Examples 1 to 4 having the above-described crystalline structure and characteristics as a "continuous grain silicon (CGS)".

In the conventional semiconductor thin films, the crystal grain boundaries act as a barrier preventing migration of carriers. In the semiconductor thin film obtained by the production processes of Examples 1 to 4, higher carrier mobility can be realized because there is substantially no such crystal grain boundary. Accordingly, a TFT produced by using the semiconductor thin film obtained by the production processes of Examples 1 to 4 exhibits very excellent electric characteristic values, which is then described below.

(Knowledge About Electric Characteristics of TFT)

Because the semiconductor films obtained by the production processes of Examples 1 to 4 can be practically considered as a single crystal (i.e., there is substantially no crystal grain boundary), a TFT using the same as an active layer exhibits electric characteristics equivalent to those of a MOS-FFT using a single crystal silicon. The following results are obtained from a TFT experimentally produced by the inventors:

(1) The subthreshold coefficient, which is an index of the switching performance (quickness of on/off changeover) of a TFT, is as small as from 60 to 100 mV/decade (typically from 60 to 85 mV/decade) for both an N-channel TFT and a P-channel TFT.

(2) The electric field effect mobility ($\mu_{FE}$), which is an index of the operation speed of a TFT, is as large as from 200 to 650 cm$^2$/Vs (typically from 250 to 300 cm$^2$/Vs) for an N-channel TFT and from 100 to 300 cm$^2$/Vs (typically from 150 to 200 cm$^2$/Vs) for a P-channel TFT.

(3) The threshold voltage ($V_{th}$), which is an index of the driving voltage of a TFT, is as small as from −0.5 to 1.5 V for an N-channel TFT and from −1.5 to 0.5 V for a P-channel TFT.

It is thus confirmed that extremely excellent switching characteristics and high speed operation characteristics are realized.

Upon production of CGS, the annealing step at a temperature (from 700 to 1,100° C.) higher than the crystallization temperature acts an important role, which is described later.

It is understood from the foregoing that the gettering process of the catalytic element is necessary for the production of CGS. The inventors consider the model described below for the phenomenon occurring in the gettering process.

In the state shown in FIG. 26A, the catalytic element (typically nickel) are segregated at the defects (mainly stacking faults) in the crystal grains. It is therefore considered that there are a large number of bonds such as an Si—Ni—Si bond.

The Si—Ni bond is severed when Ni present at the defect is removed by conducting the gettering process of the catalytic element, and then the remaining unpaired bonds of silicon immediately form an Si—Si bond, so as to be stabilized. The defect is thus dispelled.

While it has been known that a thermal annealing at a high temperature dispels a defect in a crystalline silicon film, it is considered that a large number of unpaired bonds are generated by severing a bond with nickel, and recombination of silicon proceeds smoothly.

The inventors also consider the model in which the crystalline silicon film and the underlying firmly stick together to heighten the adhesion between them by conducting a heat treatment at a temperature (from 700 to 1,100° C.) higher than the crystallization temperature, and thus a defect is dispelled.

(Knowledge About Relationship Between TFT Characteristics and CGS)

The above-described excellent TFT characteristics greatly reside in that the semiconductor thin film having continuity of the crystalline lattice at the crystal grain boundaries is used as an active layer of the TFT, the reason of which is considered below.

The continuity of crystalline lattice at crystal grain boundary originates in the fact that the crystal grain boundary is one called the "planar boundary". The definition of the planar boundary used herein is in accordance with the "planar boundary" described in "Characterization of High-Efficiency Cast-Si Solar Cell Wafers by MBIC Measurement" by Ryuichi Shimokawa and Yutaka Hayashi, *Japanese Journal of Applied Physics*, vol. 27, No. 5, pp. 751-758 (1998).

According to the above literature, the planar boundary includes the {111} twin boundary, the {111} stacking fault, the {221} twin boundary and the {221} twist boundary. The planar boundary has characteristics in that it is electrically inert. In other words, the planar boundary does not act as a trap inhibiting carrier migration though it is a crystal grain boundary, and thus it can be considered as non-existence.

Particularly, the {111} twin boundary is called the coincidence boundary of Σ3, and the {221} twin boundary is called the coincidence boundary of Σ9. The Σ value is a factor as an index of a degree of coordination of the coincidence boundary. It is known that the smaller the Σ value is, the better the coordination of the boundary is.

As a result of detailed observation by TEM of the semiconductor thin films obtained by the production processes of Examples 1 to 4, it was found that most (90% or more, typically 95% or more) of the crystal grain boundaries are the coincidence boundaries of Σ3, i.e., the {111} twin boundaries.Σ9

At the crystal grain boundary formed between two crystal grains, in the case where the plane azimuths of both the crystals are {110}, it is known that the crystal grain boundary becomes the coincidence boundary of Σ3 when θ is 70.5°, where θ represents an angle formed by the lattice stripes corresponding to the {111} plane.

Therefore, at the crystal grain boundary shown in the TEM photograph of FIG. 24A, the lattice stripes of each of the neighboring crystal grains continue at an angle of about 70°, and it is easily estimated that the crystal grain boundary is the {111} twin boundary.

When θ is 38.9°, it becomes the coincidence boundary of Σ9, which is also present.

Such a coincidence boundary is formed only between crystal grains having the same plane azimuth. Because the semiconductor thin film obtained by the production processes of Examples 1 to 4 has plane azimuth that are substantially matched {110}, such a coincidence boundaries are formed in a wide range. This characteristic feature is not found in the other polysilicon films where the plane azimuth is irregular.

FIG. 27A shows a TEM photograph (dark-field image) of the semiconductor thin films obtained by the production processes of Examples 1 to 4 at a magnification of 15,000. While there are white regions and black regions, it is indicated that regions having the same color have the same orientation.

It is noted in FIG. 27A that even in the dark-field image of such a wide area, the white regions continuously get together in such a high extent. This means that crystal grains having the same orientation are present in a certain direction, and the neighboring crystal grains have substantially the same orientation.

FIG. 27B shows a TEM photograph (dark-field image) of the conventional high temperature polysilicon film at a magnification of 15,000. In the conventional high temperature polysilicon film, the regions having the same plane azimuth are scattered, and the gathered part in the certain direction as in FIG. 27A cannot be found. It is considered that this is because the orientation of the neighboring crystal grains is entirely irregular.

The inventors conduct repeated observations and measurements throughout a large number of regions other than the measured region shown in FIG. 27A, and confirm that the continuity of the crystal lattice at the crystal grain boundaries is maintained in a wide area sufficient to produce a TFT.

According to the invention, a non-volatile memory can be simultaneously integrated with a pixel TFT, a driver circuit and other peripheral circuits, and a liquid crystal display device can be miniaturized and can have high performance. Since data for gamma correction can be stored in the non-volatile memory, a liquid crystal display device of good gradation display can be realized.

What is claimed is:

1. A cellular phone having a non-volatile memory, the non-volatile memory comprising:
   a first thin film transistor and a second thin transistor formed over a substrate,
   wherein the first thin film transistor comprises:
      a first semiconductor layer having first source and drain regions and a first channel region interposed therebetween;
      a gate electrode formed over the first channel region with a first gate insulating film interposed therebetween; and
      a second insulating film formed over the gate electrode,
   wherein the second thin film transistor comprises:
      a second semiconductor layer having second source and drain regions and a second channel region interposed therebetween;
      a floating gate electrode formed over the second channel region with a second gate insulating film interposed therebetween;
      a third insulating film formed over the floating gate electrode; and
      a control gate electrode formed over the third insulating film,
   wherein an interlayer insulating film is formed over and in contact with the second insulating film and the control gate electrode, and
   wherein the substrate is an insulating substrate.

2. The cellular phone according to claim 1, wherein the third insulating film is an anodic oxide film of the floating gate electrode.

3. The cellular phone according to claim 1, wherein the first thin film transistor and the second thin film transistor are connected in series.

4. A cellular phone having a non-volatile memory, the non-volatile memory comprising:
   a first thin film transistor and a second thin transistor formed over a substrate,
   wherein the first thin film transistor comprises:
      a first semiconductor layer having first source and drain regions and a first channel region interposed therebetween;
      a gate electrode formed over the first channel region with a first gate insulating film interposed therebetween; and
      a second insulating film formed over the gate electrode,
   wherein the second thin film transistor comprises:
      a second semiconductor layer having second source and drain regions and a second channel region interposed therebetween;
      a floating gate electrode formed over the second channel region with a second gate insulating film interposed therebetween;
      a third insulating film formed over the floating gate electrode; and
      a control gate electrode formed over the third insulating film,
   wherein an interlayer insulating film is formed over and in contact with the second insulating film and the control gate electrode,
   wherein the first thin film transistor and the second thin film transistor have the same conductivity, and
   wherein the substrate is an insulating substrate.

5. The cellular phone according to claim 4, wherein the third insulating film is an anodic oxide film of the floating gate electrode.

6. The cellular phone according to claim 4, wherein the first thin film transistor and the second thin film transistor are connected in series.

7. A cellular phone having a non-volatile memory, the non-volatile memory comprising:
   a first thin film transistor and a second thin transistor formed over a substrate,
   wherein the first thin film transistor comprises:
      a first semiconductor layer having first source and drain regions and a first channel region interposed therebetween;

a gate electrode formed over the first channel region with a first gate insulating film interposed therebetween; and a second insulating film formed over the gate electrode, wherein the second thin film transistor comprises:
a second semiconductor layer having second source and drain regions and a second channel region interposed therebetween;
a floating gate electrode formed over the second channel region with a second gate insulating film interposed therebetween;
a third insulating film formed over the floating gate electrode; and
a control gate electrode formed over the third insulating film,
wherein an interlayer insulating film is formed over and in contact with the second insulating film and the control gate electrode,
wherein the first thin film transistor has n-type conductivity and the second thin film transistor has p-type conductivity, and
wherein the substrate is an insulating substrate.

8. The cellular phone according to claim 7, wherein the third insulating film is an anodic oxide film of the floating gate electrode.

9. The cellular phone according to claim 7, wherein the first thin film transistor and the second thin film transistor are connected in series.

10. A camera having a non-volatile memory, the non-volatile memory comprising:
a first thin film transistor and a second thin transistor formed over a substrate,
wherein the first thin film transistor comprises:
a first semiconductor layer having first source and drain regions and a first channel region interposed therebetween;
a gate electrode formed over the first channel region with a first gate insulating film interposed therebetween; and
a second insulating film formed over the gate electrode, wherein the second thin film transistor comprises:
a second semiconductor layer having second source and drain regions and a second channel region interposed therebetween;
a floating gate electrode formed over the second channel region with a second gate insulating film interposed therebetween;
a third insulating film formed over the floating gate electrode; and
a control gate electrode formed over the third insulating film,
wherein an interlayer insulating film is formed over and in contact with the second insulating film and the control gate electrode, and
wherein the substrate is an insulating substrate.

11. The camera according to claim 10, wherein the third insulating film is an anodic oxide film of the floating gate electrode.

12. The camera according to claim 10, wherein the first thin film transistor and the second thin film transistor are connected in series.

13. A camera having a non-volatile memory, the non-volatile memory comprising:
a first thin film transistor and a second thin transistor formed over a substrate,
wherein the first thin film transistor comprises:
a first semiconductor layer having first source and drain regions and a first channel region interposed therebetween;
a gate electrode formed over the first channel region with a first gate insulating film interposed therebetween; and
a second insulating film formed over the gate electrode, wherein the second thin film transistor comprises:
a second semiconductor layer having second source and drain regions and a second channel region interposed therebetween;
a floating gate electrode formed over the second channel region with a second gate insulating film interposed therebetween;
a third insulating film formed over the floating gate electrode; and
a control gate electrode formed over the third insulating film,
wherein an interlayer insulating film is formed over and in contact with the second insulating film and the control gate electrode,
wherein the first thin film transistor and the second thin film transistor have the same conductivity, and
wherein the substrate is an insulating substrate.

14. The camera according to claim 13, wherein the third insulating film is an anodic oxide film of the floating gate electrode.

15. The camera according to claim 13, wherein the first thin film transistor and the second thin film transistor are connected in series.

16. A camera having a non-volatile memory, the non-volatile memory comprising:
a first thin film transistor and a second thin transistor formed over a substrate,
wherein the first thin film transistor comprises:
a first semiconductor layer having first source and drain regions and a first channel region interposed therebetween;
a gate electrode formed over the first channel region with a first gate insulating film interposed therebetween; and
a second insulating film formed over the gate electrode, wherein the second thin film transistor comprises:
a second semiconductor layer having second source and drain regions and a second channel region interposed therebetween;
a floating gate electrode formed over the second channel region with a second gate insulating film interposed therebetween;
a third insulating film formed over the floating gate electrode; and
a control gate electrode formed over the third insulating film,
wherein an interlayer insulating film is formed over and in contact with the second insulating film and the control gate electrode,
wherein the first thin film transistor has n-type conductivity and the second thin film transistor has p-type conductivity, and
wherein the substrate is an insulating substrate.

17. The camera according to claim 16, wherein the third insulating film is an anodic oxide film of the floating gate electrode.

18. The camera according to claim 16, wherein the first thin film transistor and the second thin film transistor are connected in series.

19. The cellular phone according to claim 1, wherein the first channel region and the second channel region are in a single crystal form.

20. The cellular phone according to claim 4, wherein the first channel region and the second channel region are in a single crystal form.

21. The cellular phone according to claim 7, wherein the first channel region and the second channel region are in a single crystal form.

22. The camera according to claim 10, wherein the first channel region and the second channel region are in a single crystal form.

23. The camera according to claim 13, wherein the first channel region and the second channel region are in a single crystal form.

24. The camera according to claim 16, wherein the first channel region and the second channel region are in a single crystal form.

* * * * *